United States Patent
Schneider et al.

(10) Patent No.: US 11,360,161 B2
(45) Date of Patent: Jun. 14, 2022

(54) COMPENSATING FOR DISTORTION IN AN ELECTROMAGNETIC TRACKING SYSTEM

(71) Applicant: Northern Digital Inc., Waterloo (CA)

(72) Inventors: Mark Robert Schneider, Williston, VT (US); Kenji Fujioka, Burlington, VT (US)

(73) Assignee: Northern Digital Inc., Waterloo (CA)

( * ) Notice: Subject to any disclaimer, the term of this patent is extended or adjusted under 35 U.S.C. 154(b) by 3 days.

(21) Appl. No.: 16/271,022

(22) Filed: Feb. 8, 2019

(65) Prior Publication Data
US 2019/0242952 A1    Aug. 8, 2019

Related U.S. Application Data

(60) Provisional application No. 62/627,897, filed on Feb. 8, 2018.

(51) Int. Cl.
*G01R 33/025* (2006.01)
*G06F 3/01* (2006.01)

(52) U.S. Cl.
CPC ........ *G01R 33/025* (2013.01); *G06F 3/012* (2013.01)

(58) Field of Classification Search
CPC ....... G01R 33/025; G01R 33/02; G06F 3/012; G01S 5/0009; G01S 5/16; G01V 3/104; G02B 27/0172; H04B 5/0043
See application file for complete search history.

(56) References Cited

U.S. PATENT DOCUMENTS

| | | |
|---|---|---|
| 5,831,260 A | 11/1998 | Hansen |
| 6,147,480 A | 11/2000 | Osadchy et al. |

(Continued)

FOREIGN PATENT DOCUMENTS

| | | |
|---|---|---|
| CA | 2919901 | 8/2016 |
| CN | 104077809 | 10/2014 |

(Continued)

OTHER PUBLICATIONS

"Software links," last modified on Aug. 23, 2017, retrieved on Sep. 9, 2019, URL <http://deeplearning.net/software_links>, 2 pages.

(Continued)

*Primary Examiner* — Tung X Nguyen
*Assistant Examiner* — Feba Pothen
(74) *Attorney, Agent, or Firm* — Fish & Richardson P.C.

(57) ABSTRACT

A system comprising: a magnetic transmitter configured to generate magnetic fields; a magnetic sensor configured to generate signals based on characteristics of the magnetic fields received at the magnetic sensor; and one or more computer systems configured to: receive the signals from the magnetic sensor; determine, based on the signals received from the magnetic sensor, an electromagnetic (EM) pose of the magnetic sensor relative to the magnetic transmitter; determine one or both of: i) an inertial pose of the magnetic sensor relative to the magnetic transmitter based on inertial data associated with the magnetic transmitter and the magnetic sensor, or ii) an optical pose of the magnetic sensor relative to the magnetic transmitter based on optical data associated with the magnetic transmitter and the magnetic sensor; determine an estimated pose of the magnetic sensor relative to the magnetic transmitter based on the EM pose and the one or both of the inertial pose or the optical pose; determine distorted magnetic fields based on the EM pose; determine estimated clean magnetic fields based on the estimated pose; determine estimated distorted magnetic fields based on the distorted magnetic fields and the estimated clean fields; and determine an improved EM pose of the magnetic sensor relative to the magnetic transmitter based on the estimated distorted magnetic fields.

25 Claims, 6 Drawing Sheets

(56) References Cited

U.S. PATENT DOCUMENTS

| | | | |
|---|---|---|---|
| 6,154,024 | A | 11/2000 | Lewandowski et al. |
| 6,172,499 | B1 | 1/2001 | Ashe |
| 6,427,079 | B1 | 7/2002 | Schneider et al. |
| 6,474,159 | B1 | 11/2002 | Foxlin et al. |
| 6,528,989 | B1 | 3/2003 | Hansen |
| 6,681,629 | B2 | 1/2004 | Foxlin et al. |
| 6,968,846 | B2 | 11/2005 | Viswanathan |
| 7,321,228 | B2 | 1/2008 | Govari |
| 7,640,106 | B1 | 12/2009 | Stokar et al. |
| 7,788,060 | B2 | 8/2010 | Schneider |
| 8,957,812 | B1 | 2/2015 | Hill |
| 9,495,801 | B2 | 11/2016 | Ebstyne et al. |
| 9,524,434 | B2 | 12/2016 | Gee et al. |
| 9,600,936 | B2 | 3/2017 | Boivin et al. |
| 9,832,452 | B1* | 11/2017 | Fotland ............... G06F 3/0304 |
| 10,746,815 | B2* | 8/2020 | Miller ................. G01B 7/003 |
| 2005/0107687 | A1* | 5/2005 | Anderson ............. A61B 34/20 600/424 |
| 2009/0048509 | A1 | 2/2009 | Wu |
| 2013/0238270 | A1* | 9/2013 | Khalfin ................ G05G 9/00 702/94 |
| 2015/0317833 | A1* | 11/2015 | Ebstyne ............. G02B 27/017 345/633 |
| 2016/0258782 | A1 | 9/2016 | Sadjadi et al. |
| 2016/0259404 | A1 | 9/2016 | Woods |
| 2017/0103578 | A1 | 4/2017 | Fukuchi et al. |
| 2017/0122736 | A1 | 5/2017 | Dold et al. |
| 2017/0147003 | A1 | 5/2017 | Karlsson et al. |
| 2018/0180682 | A1* | 6/2018 | Miller .................. G06F 30/20 |
| 2019/0086482 | A1* | 3/2019 | Chung ................ G01S 5/0009 |

FOREIGN PATENT DOCUMENTS

| | | |
|---|---|---|
| CN | 104062977 | 4/2017 |
| CN | 106679648 | 12/2019 |
| KR | 1020160068815 | 6/2016 |
| WO | WO 2013167901 | 11/2013 |

OTHER PUBLICATIONS

Brian Williams. 16.412J Cognitive Robotics. Spring 2016. Massachusetts Institute of Technology: MIT OpenCourseWare, https://ocw.mit.edu. License: Creative Commons BY-NC-SA.

German Search Report in German Application No. 102019201522, dated Sep. 13, 2019, 12 pages.

Kindratenko et al., "Neural network-based calibration of electromagnetic tracking systems," Virtual Reality, 2005, 9:70-78.

Kindratenko, "A survey of electromagnetic position tracker calibration techniques," Virtual Reality: Research, Development, and Applications, 2000, 5(3):169-182.

Malisiewicz, "The Future of Real-Time SLAM and Deep Learning vs. SLAM," Tombone's Computer Vision Blog, 2016, URL: <http://www.computervisionblog.com/2016/01/why-slam-matters-future-of-real-time. Html>.

No Author Listed, "Open source electromagnetic trackers," NAMIC, last modified Jan. 14, 2018, URL: https://na-mic.org/wiki/Open_Source_Electromagnetic_Trackers.

No Author Listed, "Simultaneity," Wikipedia, last modified Jun. 25, 2019, URL: https://en.wikipedia.org/wiki/Simultaneous_localization_and_mapping.

No Author Listed, "Virtual Reality v. Augmented Reality," Augment, 2015, URL: <http://www.augment.com/blog/virtual-reality-vs-augmented-reality/>.

No Author Listed, "VR? AR? MR? Sony, I'm Confused," Foundry, 2017, URL: <https://www.foundry.com/industries/virtual-reality/vr-mr-ar-confused>.

Teichman et al., "Unsupervised intrinsic calibration of depth sensors via SLAM," Robotics Proceedings, (undated), 8 pages.

Vaccarella, "Unscented kalman filter based sensor fusion for robust optical and electromagnetic tracking in surgical navigation," Transactions on Instrumentation and Measurement, 2013, 62(7):2067-2081 doi: 10.1109/TIM.2013.2248304.

Welch et al., "Incremental tracking with incomplete information," Proceeding of the 24th annual conference on computer graphics and interactive techniques, 1997, 333-344 doi: 10.1145/258734.258876.

Wen, "Electromagnetic Tracking for Medical Imaging," All Theses and Dissertations (ETDs), 2010, 469, URL: https://openscholarship.wustl.edu/etd/469.

Zhang et al., "Sensor Fusion of Monocular Cameras and Laser Rangefinders for Line-Based Simultaneous Localization and Mapping (SLAM) Tasks in Autonomous Mobile Robots," Sensors, 2012, 12:429-452.

Arfken et al., "Mathematical Methods for Physicists," 4th Edition, Elsevier, Waltham, MA, Oct. 4, 1995, 1029 pages (Abstract only, 9 pages).

Andrews et al., "Global Positioning Systems Inertial Navigation, and Integration, Second Edition," Feb. 2007, John Wiley & Sons, Inc., Appendix C, pp. 456-501.

Campolo et al., "A Novel Procedure for In-field Calibration of Sourceless Inertial/Magnetic Orientation Tracking Wearable Devices," International Conference on Biomedical Robotics and Biomechatronics, Feb. 2006, 7 pages.

Cheng et al., "Using Multiscale Kernel Models to Reconstruct Multivariate Functions from Scattered Data," 2008 International Conference on Computer Science and Software Engineering, Dec. 12, 2008, 367-370.

Deeplearning.net [online], "Software Links," available on or before Jan. 12, 2011, via Internet Archive: Wayback Machine URL<https://web.archive.org/web/20120112090701/http://deeplearning.net:80/software_links/>, retrieved on Dec. 7, 2021, URL<http://deeplearning.net/softwarelinks/>, 2 pages.

Farrell et al., "The Global Positioning System and Inertial Navigation," McGraw-Hill Education, 1999, 340 pages (English Abstract Only).

Hammond et al., "Electric and Magnetic Images," The Institution of Electrical Engineers, May 1960, 306-313.

He et al., "An Inertial and Optical Sensor Fusion Approach for Six Degree-of-Freedom Pose Estimation," Sensors, Jul. 8, 2015, 15:16448-16465.

Hinberg et al., "Latency and Distortion of Electromagnetic Trackers for Augmented Reality Systems," Synthesis Lectures on Algorithms and Software in engineering, May 31, 2014, 191 pages.

Jud et al., "Motion Tracking Systems: An overview of motion tracking methods," Studies on Mechatronics, Swiss Federal Institute of Technology, Spring Term 201, 81 pages.

Kelly et al., "Visual-Inertial Simultaneous Localization, Mapping and Sensor-to-Sensor Self-Calibration," CIRA, Dec. 15-18, 2009, 360-368.

Kindratenko, "A survey of electromagnetic position tracker calibration techniques," Virtual Reality: Research, Development, and Applications, Sep. 2000, retrieved from URL<http://www.ncsa.illinois.edu/People/kindr/papers/vr00 paper,pdf>. pp. 169-182.

Kuipers, "Quaternions and Rotation Sequences," Princeton University Press, 1999, 371 pages (Abstract Only).

Ligorio et al., "Extended Kalman Filter-Based Methods for Pose Estimation Using Visual, Inertial and Magnetic Sensors: Comparative Analysis and Performance Evaluation," Sensors, Feb. 4, 2013, 13:1919-19414.

Lyen et al., "A Robust and Modular Multi-Sensor Fusion Approach Applied to MAV Navigation," 2013 IEEE/RSJ International Conference on Intelligent Robots and Systems, Nov. 3-7, 2013, 7 pages.

Lynen et al., "Tightly Coupled Visual-Inertial Navigation System Using Optical Flow," IFAC Proceedings Volumes, Jan. 1, 2013, 30:251-256.

Nixon et al., "The Effects of Metals and Interfering Fields on Electromagnetic Trackers," Presence, Apr. 1998, 7:204-2018.

Powell, "Radial basis function methods for interpolation to functions of many variables," InHERCMA, Sep. 2001, 23 pages.

Roetenberg, "Inertial and Magnetic Sensing of Human Motion," These de doctorat, May 24, 2006, 126 pages.

Schaback, "A Practical Guide to Radial Basis Function," Electronic Resource, Apr. 16, 2017, 11:1-58.

(56) References Cited

OTHER PUBLICATIONS

Schepers et al., "Ambulatory human motion tracking by fusion of inertial and magnetic sensing with adaptive actuation," Med Bilo Eng Comput, Dec. 17, 2009, 48:27-37.

Teichman et al., "Unsupervised intrinsic calibration of depth sensors via SLAM," InRobotics: Science and Systems, Jun. 2013, retrieved from URL<http://www.roboticsproceedings.org/rss09/p27.pdf>, 8 pages.

Weiss et al., "Monocular-SLAM-Based Navigation for Autonomous Micro Helicopters in GPS-Denied Environments," Journal of Field Robotics, Jun. 24, 2011, 6:854-874.

Weiss et al., "Real-Time Metric State Estimation for Modular Vision-Inertial Systems," 2011 IEEE International Conference on Robotics and Automation, May 9-13, 2011, Shanghai, China, pp. 4531-4537.

Weiss, "Vision based navigation for micro helicopters," ETH Zurich, A dissertation submitted to Eth Zurich, Diss. ETH No. 20305, Jan. 2012, 222 pages.

Wikipedia.org, [online], "Simultaneous localization and mapping," Nov. 28, 2021, retrieved on Dec. 7, 2021, URL<https://en.wikipedia.org/wiki/Simultaneous_localization_and_mapping>, 10 pages.

Zhang et al., "Sensor Fusion of Monocular Cameras and Laser Rangefinders for Line-Based Simultaneous Localization and Mapping (SLAM) Tasks in Autonomous Mobile Robots," Sensors, published Jan. 4, 2012, retrieved from URL<https://www.ncbi.nlm.nih.gov/pmc/articles/PMC3279222/>, 12: 429-452.

* cited by examiner

COMPENSATING FOR DISTORTION IN AN ELECTROMAGNETIC TRACKING SYSTEM

CLAIM OF PRIORITY

This application claims priority under 35 USC § 119(e) to U.S. Patent Application Ser. No. 62/627,897, filed on Feb. 8, 2018, the entire contents of which are hereby incorporated by reference.

TECHNICAL FIELD

This disclosure relates to compensating for distortion in an electromagnetic tracking (EMT) system.

BACKGROUND

Augmented Reality (AR) and Virtual Reality (VR) systems can use Electromagnetic Tracking (EMT) systems to aid location of devices in various contexts (e.g., gaming, medical, etc.). Such systems utilize a magnetic transmitter in proximity to a magnetic sensor such that the sensor and the transmitter can be spatially located relative to each other. Distortion in the tracking environment can cause the EMT system to report incorrect positions and orientation for the sensor or transmitter.

SUMMARY

An Electromagnetic Tracking (EMT) system can be used in gaming and/or surgical settings to track devices (e.g., gaming controllers, head-mounted displays, medical equipment, robotic arms, etc.), thereby allowing their respective three-dimensional positions and orientations to be known to a user of the system. Augmented Reality (AR) and Virtual Reality (VR) systems also use EMT systems to perform head, hand, and body tracking, for example, to synchronize the user's movement with the AR/VR content. Such EMT systems use a magnetic transmitter in proximity to a magnetic sensor to determine the position and/or orientation (e.g., the pose) of the sensor relative to the transmitter.

EMT systems are sensitive to metallic objects, which can manifest as distortion in the tracking environment. Such distortions can cause a position and orientation (P&O) algorithm (e.g., sometimes referred to as a pose algorithm) to report erroneous results. To ensure that the transmitter and sensor can provide accurate position and orientation measurements to the user, such distortions can be compensated for in the EMT system. For example, one or more Simultaneous Localization and Mapping (SLAM) compensation techniques can be employed by the EMT system to reduce or eliminate distortions that lead to incorrect P&O measurements. In some implementations, such SLAM compensation techniques can employ an algorithm such as a Kalman filter, for example, an extended Kalman filter (EKF).

In an aspect, in general, a system includes a magnetic transmitter configured to generate magnetic fields. The system also includes a magnetic sensor configured to generate signals based on characteristics of the magnetic fields received at the magnetic sensor. The system also includes one or more computer systems configured to receive the signals from the magnetic sensor. The one or more computer systems are also configured to determine, based on the signals received from the magnetic sensor, an electromagnetic (EM) pose of the magnetic sensor relative to the magnetic transmitter. The one or more computer systems are also configured to determine one or both of: i) an inertial pose of the magnetic sensor relative to the magnetic transmitter based on inertial data associated with the magnetic transmitter and the magnetic sensor, or ii) an optical pose of the magnetic sensor relative to the magnetic transmitter based on optical data associated with the magnetic transmitter and the magnetic sensor. The one or more computer systems are also configured to determine an estimated pose of the magnetic sensor relative to the magnetic transmitter based on the EM pose and the one or both of the inertial pose or the optical pose. The one or more computer systems are also configured to determine distorted magnetic fields based on the EM pose. The one or more computer systems are also configured to determine estimated clean magnetic fields based on the estimated pose. The one or more computer systems are also configured to determine estimated distorted magnetic fields based on the distorted magnetic fields and the estimated clean fields. The one or more computer systems are also configured to determine an improved EM pose of the magnetic sensor relative to the magnetic transmitter based on the estimated distorted magnetic fields.

Implementations can include one or more of the following features.

In some implementations, the estimated distorted magnetic fields are determined according to a compensation algorithm.

In some implementations, the compensation algorithm is configured to select a distortion model based on the distorted magnetic fields, the estimated clean magnetic fields, and the estimated pose. The compensation algorithm is also configured to identify parameters of the model using a non-linear least squares algorithm. The compensation algorithm is also configured to calculate the estimated distorted magnetic fields based on the identified parameters.

In some implementations, the distortion model includes one or more of a dipole model, a rectangular loop model, or a spherical harmonics model.

In some implementations, the estimated distorted magnetic fields are determined based on differences between the estimated clean magnetic fields and the distorted magnetic fields.

In some implementations, the estimated distorted magnetic fields represent distortion caused by an environment in which the system is operating.

In some implementations, the system includes one or more of a Virtual Reality (VR) system, an Augmented Reality (AR) system, a Mixed Reality (MR) system, or an electromagnetic tracking (EMT) system.

In some implementations, the signals received from the magnetic sensor, the distorted magnetic fields, the estimated clean magnetic fields, and the estimated distorted magnetic fields are represented as 3×3 matrices of data.

In some implementations, the estimated pose is determined by a Kalman filter.

In some implementations, the Kalman filter is an extended Kalman filter (EKF).

In some implementations, the EM pose is determined by the EKF based on the signals received from the magnetic sensor.

In some implementations, the EKF includes functionality for converting disparate raw outputs from the magnetic sensor into the EM pose.

In some implementations, the inertial data includes inertial raw data, and the EKF includes functionality for converting the inertial raw data into the inertial pose.

In some implementations, the system is tightly coupled.

In some implementations, the EM pose is determined by an EM tracker.

In some implementations, the EM tracker provides the EM pose to the EKF.

In some implementations, the system is loosely coupled.

In some implementations, the magnetic transmitter is incorporated into a controller and the magnetic sensor is incorporated into a head-mounted display (HMD).

In some implementations, the improved EM pose represents a pose of the HMD relative to a pose of the controller.

In some implementations, the improved EM pose is determined in real-time as the HMD and the controller move about a tracking environment.

In some implementations, the controller and the HMD each includes an inertial measurement unit (IMU) configured to provide the inertial data.

In some implementations, the system includes one or more optical sensors configured to provide the optical data.

In some implementations, the one or more optical sensors include one or more cameras.

In some implementations, the optical data is used to identify one or more features in a tracking environment and cause the identified features to be displayed on a screen of a HMD.

In some implementations, the EM pose includes errors due to distortions of the generated magnetic fields in a tracking environment.

In another aspect, in general, a method includes receiving, by one or more computer systems, signals from a magnetic sensor. The magnetic sensor is configured to generate the signals based on characteristics of magnetic fields generated by a magnetic transmitter and received at the magnetic sensor. The method also includes determining, based on the signals received from the magnetic sensor, an electromagnetic (EM) pose of the magnetic sensor relative to the magnetic transmitter. The method also includes determining one or both of: i) an inertial pose of the magnetic sensor relative to the magnetic transmitter based on inertial data associated with the magnetic transmitter and the magnetic sensor, or ii) an optical pose of the magnetic sensor relative to the magnetic transmitter based on optical data associated with the magnetic transmitter and the magnetic sensor. The method also includes determining an estimated pose of the magnetic sensor relative to the magnetic transmitter based on the EM pose and the one or both of the inertial pose or the optical pose. The method also includes determining distorted magnetic fields based on the EM pose. The method also includes determining estimated clean magnetic fields based on the estimated pose. The method also includes determining estimated distorted magnetic fields based on the distorted magnetic fields and the estimated clean fields. The method also includes determining an improved EM pose of the magnetic sensor relative to the magnetic transmitter based on the estimated distorted magnetic fields.

The systems and techniques described herein provide various advantages. For example, such SLAM compensation techniques can be employed by AR and VR systems in which both the transmitter and the sensor are free to move about the tracking environment. In other words, such SLAM compensation techniques can be effective in AR and VR systems in which the transmitter and/or the sensor is not fixed in the tracking environment. Distortion compensation can be performed in real-time using a recursive algorithm that considers present input measurements and the previously calculated state(s).

For implementations that include one or more tightly coupled aspects, a bandwidth of the system can be reduced, which in turn increases the signal-to-noise ratio (SNR) of the system. Tightly coupled systems are typically also harder to disrupt, because all the raw sensor data is integrated into one (e.g., single) process of the EKF. In general, tightly coupled systems can improve performance in the presence of distortion because some sensors can help compensate for deficiencies of other sensors. Further, additional filter states may be observable in tightly coupled systems, and as such, outputs having improved stability can be provided.

The details of one or more embodiments are set forth in the accompanying drawings and the description below. Other features, objects, and advantages will be apparent from the description and drawings, and from the claims.

DESCRIPTION OF DRAWINGS

Like reference symbols in the various drawings indicate like elements.

DETAILED DESCRIPTION

An Electromagnetic Tracking (EMT) system can be used in gaming and/or surgical settings to track devices (e.g., gaming controllers, head-mounted displays, medical equipment, robotic arms, etc.), thereby allowing their respective three-dimensional positions and orientations to be known to a user of the system. Augmented Reality (AR) and Virtual Reality (VR) systems also use EMT systems to perform head, hand, and body tracking, for example, to synchronize the user's movement with the AR/VR content. Such EMT systems use a magnetic transmitter in proximity to a magnetic sensor to determine the position and/or orientation (e.g., the pose) of the sensor relative to the transmitter.

EMT systems are sensitive to metallic objects, which can manifest as distortion in the tracking environment. Other types of distortion (e.g., distortion of magnetic fields generated by the transmitter and/or sensed by the sensor) may also exist. Distortion can include conductive distortion and ferromagnetic distortion. Conductive distortion is caused by eddy currents set up within conductive objects by alternating magnetic fields (e.g., such as those produced by the transmitter). The eddy currents generate additional magnetic fields, which can be indistinguishable from those produced by the transmitter. These additional fields can cause a position and orientation (P&O) algorithm (e.g., sometimes referred to as a pose algorithm) to report erroneous results. For example, the P&O algorithm is based on a magnetic field model with no additional fields due to eddy current, and as such, the reported results do not provide an accurate representation of the P&O of the transmitter and/or the sensor when these are present.

Ferromagnetic distortion is caused by magnetic reluctance of materials in the tracking environment. Such magnetic reluctance "bends" the fields from their normal geometry, again causing the fields to not fit the magnetic field model on which the P&O algorithm is based, thereby causing the P&O algorithm to report erroneous results.

To ensure that the transmitter and sensor can provide accurate position and orientation measurements to the user, such distortions can be compensated for in the EMT system. For example, one or more compensation techniques (e.g., Simultaneous Localization and Mapping (SLAM) compensation techniques) can be employed by the EMT system to reduce or eliminate distortions that lead to incorrect P&O measurements. In some implementations, such SLAM compensation techniques can employ an algorithm such as a Kalman filter, for example, an extended Kalman filter (EKF). Such SLAM compensation techniques can be employed by AR and VR systems, such as those described herein, in which both the transmitter and the sensor are free to move about the tracking environment. In other words, such SLAM compensation techniques can be effective in AR and VR systems in which the transmitter and/or the sensor is not fixed in the tracking environment.

Figure 1:
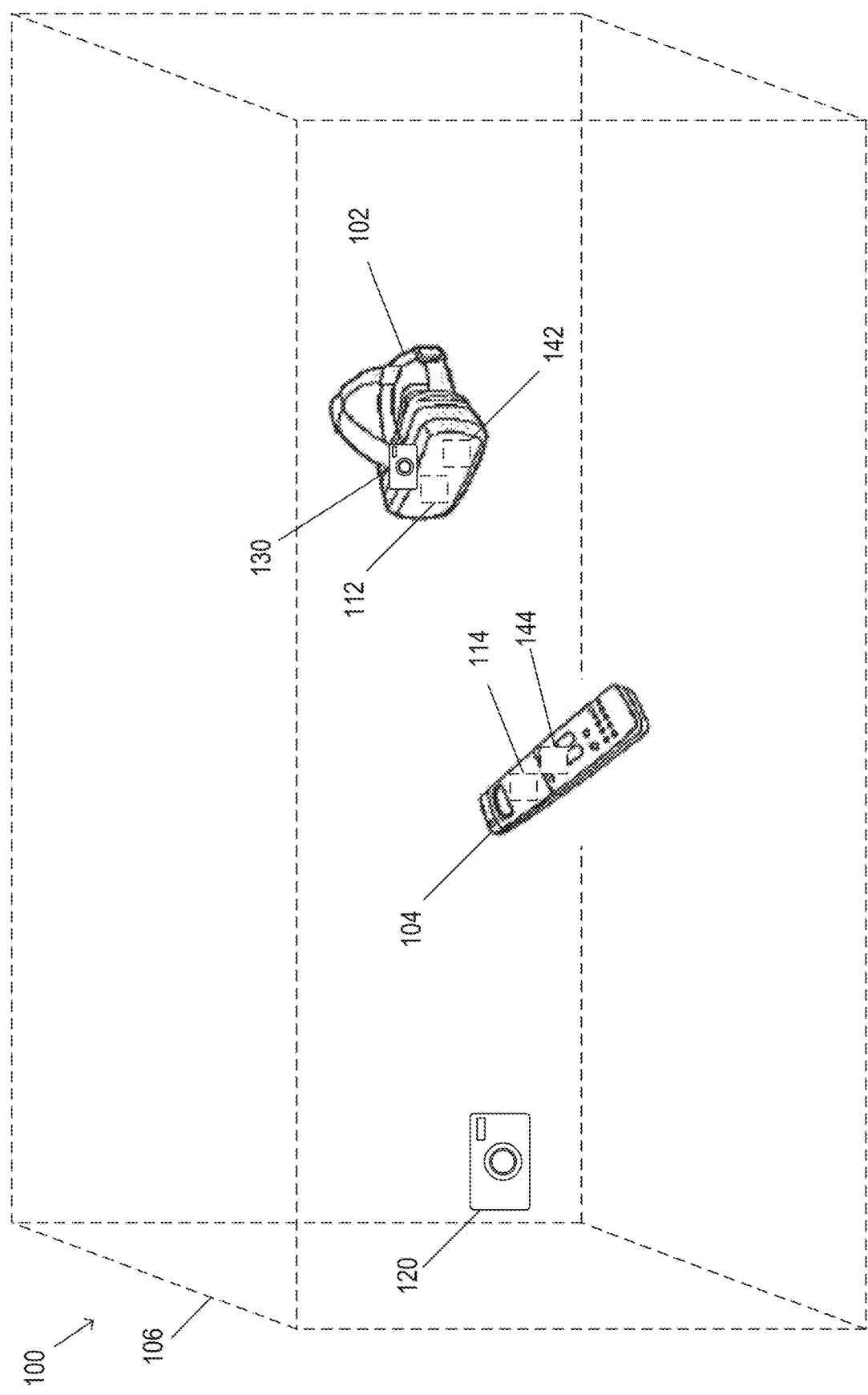
FIG. 1 shows an example Electromagnetic Tracking (EMT) system.

FIG. 1 shows an example of an EMT system 100 that can be used as part of an AR/VR system. The EMT system 100 includes at least a head-mounted display (HMD) 102 that includes a magnetic sensor 112 and a controller 104 that includes a magnetic transmitter 114.

In some examples, a VR system uses computer technology to simulate the user's physical presence in a virtual or imaginary environment. VR systems may create three-dimensional images and/or sounds through the HMD 102 and tactile sensations through haptic devices in the controller 104 or wearable devices to provide an interactive and immersive computer-generated sensory experience. In contrast, AR systems may overlay computer-generated sensory input atop the user's live experience to enhance the user's perception of reality. For example, AR systems may provide sound, graphics, and/or relevant information (e.g., such as GPS data to the user during a navigation procedure). Mixed Reality (MR) systems—sometimes referred to as hybrid reality systems—may merge real and virtual worlds to produce new environments and visualizations where physical and digital objects co-exist and interact in real-time. A key characteristic of MR is that the synthetic content and the real-world content can react to each other in real-time.

The HMD 102 and the controller 104 are configured to track position (e.g., in x, y, and z) and orientation (e.g., in azimuth, altitude, and roll) in three-dimensional space relative to each other. For example, the HMD 102 is configured to track the sensor 112 of the HMD 102 relative to a reference frame defined by the transmitter 114 of the controller 104 thereby allowing the HMD 102 to determine the position and orientation of the sensor 112 within a tracking environment 106. In this way, the HMD 102 and the controller 104 can be used to perform head, hand, and/or body tracking, for example, to synchronize the user's movement with the AR/VR content. While the tracking environment 106 is illustrated as being a defined space, it should be understood that the tracking environment 106 may be any three-dimensional space, including three-dimensional spaces without boundaries (e.g., large indoor and/or outdoor areas, etc.). The particular sensor 112 and transmitter 114 employed by the EMT system 100 may be determined by the procedure type, measurement performance requirements, etc.

In some implementations, the transmitter 114 includes three orthogonally wound magnetic coils, referred to herein as the x, y, and z coils. Electrical currents traveling through the three coils cause the coils to produce three orthogonal sinusoidal magnetic fields at three frequencies (e.g., three different frequencies). The three frequencies may be three closely spaced frequencies, e.g., 34 KHz, 34.25 KHz, and 34.5 KHz, although other frequencies can also or alternatively be used. Time division multiplexing (TDM) may also be used, that is, in some implementations, the coils may produce magnetic fields at the same frequency (e.g., 34 KHz) but at non-overlapping times. The sensor 112 also includes three orthogonally wound magnetic coils, referred to herein as the x, y, and z coils. Voltages are induced in the coils of the sensor 112 in response to the sensed magnetic fields by means of magnetic induction. Each coil of the sensor 112 generates an electrical signal for each of the magnetic fields generated by the coils of the transmitter 114; for example, the x coil of the sensor 112 generates a first electrical signal in response to the magnetic field received from the x coil of the transmitter 114, a second electrical signal in response to the magnetic field received from they coil of the transmitter 114, and a third electrical signal in response to the magnetic field received from the z coil of the transmitter 114. They and z coils of the sensor 112 similarly generate electrical signals for each of the magnetic fields generated by the coils of the transmitter 114.

The AR/VR system and/or the EMT system 100 can include one or more additional devices/systems for improving the determination of the position and orientation of the HMD 102 with respect to the controller 104. For example, such additional devices/systems can be used to compensate for (e.g., negate) errors included in the measured positions and orientations based on the electromagnetic tracking technique due to distortions.

The AR/VR system includes one or more optical tracking devices. In the illustrated example, the AR/VR system includes a global optical tracking device 120 (e.g., sometimes referred to as a large volume tracker) and a local optical tracking device 130. In some implementations, the global optical tracking device 120 and/or the local optical tracking device 130 is a camera (e.g., a video camera).

The global optical tracking device 120 may be configured to track the HMD 102 and the controller 104 within the tracking environment 106. For example, the global optical tracking device 120 may identify visual features of the HMD 102 and/or the controller 104 and determine a position and orientation of the HMD 102 and/or the controller 104 relative to the global optical tracking device 120. The global optical tracking device 120 can be positioned at a known position and orientation at or near the tracking environment 106 (e.g., in a corner of a room). Thus, the measured positions and orientations of the HMD 102 and/or the controller 104 relative to the global optical tracking device 120 may be used to determine and/or assist in determining the position and orientation of the HMD 102 and/or the controller 104 relative to the tracking environment 106 and relative to each other. In some implementations, the line of sight tracking from the global optical tracking device 120 can be blocked due to room geometry, furniture and/or fixtures, and/or user movements and may not necessarily provide continuous tracking information.

The local optical tracking device 130 may be positioned at the HMD 102 and configured to, among other things, track the controller 104 relative to the HMD 102. For example, the local optical tracking device 130 may identify visual features of the controller 104 and determine a position and orientation of the controller 104 relative to the HMD 102. Thus, if the position and orientation of the HMD 102 is known (e.g., due to measurements by the EMT system 100, and/or measurements from the global optical tracking device 120, etc.), the position and orientation of the controller 104 within the tracking environment 106 can be determined. In some implementations, the line of sight tracking from the local optical tracking device 130 can be blocked due to room geometry, furniture and/or fixtures, and/or user movements and may not necessarily provide continuous tracking information.

In some implementations, the global optical tracking device 120 and/or the local optical tracking device 130 may be configured to perform feature extraction functions. For example, the global optical tracking device 120 may be configured to identify features in the tracking environment 106 such as HMD 102 and controller 104. The local optical tracking device 130 may be configured to identify features in the tracking environment 106 such as controller 104.

In some implementations, one or more items within the tracking environment 106 may include one or more markers that are configured to be identified by the global optical tracking device 120 and/or the local optical tracking device 130. For example, the HMD 102 and/or the controller 104 may include one or more markers that the global optical tracking device 120 and/or the local optical tracking device 130 may visually identify (e.g., rather than the global optical tracking device 120 and/or the local optical tracking device 130 being configured to identify the HMD 102 and/or the controller 104 independently). Such markers may include information indicating whether the markers correspond to the HMD 102 or the controller 104. Such markers may assist the global optical tracking device 120 and/or the local optical tracking device 130 in accurately determining the position and orientation of the HMD 102 and/or the controller 104.

The AR/VR system can also include one or more inertial measurement units (IMU) to assist in determining the position and orientation of the HMD 102 and the controller 104. Such IMU can be configured to measure specific force and/or angular rate, which can be used to determine an orientation, heading, velocity, and/or acceleration of the IMU (or an object in which the IMU is incorporated). The determined velocity and/or acceleration can be used to determine a change in position of the IMU over time.

In the illustrated example, the HMD 102 includes an IMU 142 and the controller 104 includes an IMU 144 configured to collect inertial data. In particular, the IMU 142, 144 is configured to measure a specific force, angular rate, and in some cases a magnetic field surrounding the HMD 102 and the controller 104. In some implementations, the IMU 142, 144 includes one or more accelerometers and/or one or more gyroscopes.

The data collected by the IMU 142, 144 is used to determine one or more of orientation, heading, velocity, and/or acceleration of the HMD 102 and the controller 104 over time. Such data can be used in combination with the position and orientation information determined by the EMT system 100 (e.g., using measurements of magnetic fields generated by the transmitter 114 and received by the sensor 112) and/or the optical tracking devices 120, 130 to improve an accuracy of the measured position and orientation of the HMD 102 and the controller 104. For example, suppose the EMT system 100 determines, based on data collected by the sensor 112, that the HMD 102 and the controller 104 are located at a particular position and orientation relative to each other at a first point in time. At a second point in time, distortion in the tracking environment 106 may cause the EMT system 100 to be unable to determine the position and orientation of the HMD 102 and the controller 104 to an acceptable degree of accuracy. As such, orientation, heading, velocity, and/or acceleration information obtained based on measurements from the IMU 142, 144 may be used to determine a change in position of the HMD 102 and the controller 104 from the first point in time to the second point in time. In this way, different data from different positioning systems can be used together to provide an accurate determination of the position and orientation of the HMD 102 and the controller 104, as described in more detail below.

Figure 2:
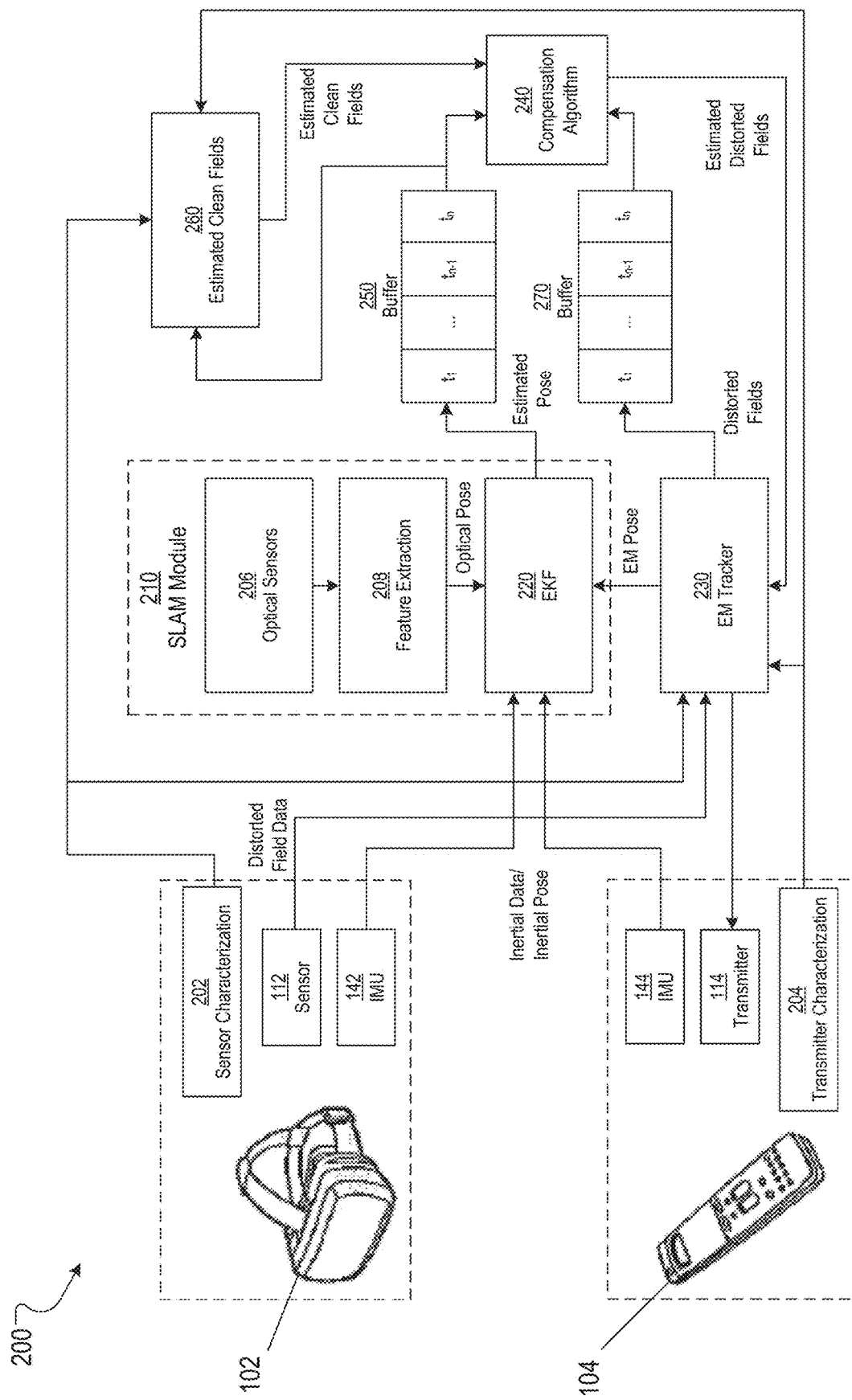
FIG. 2 shows a schematic diagram of an example of a Simultaneous Localization and Mapping (SLAM) distortion correction system that includes a compensation algorithm.

The position and orientation of the sensor 112 and the transmitter 114 (e.g., the position and orientation of the HMD 102 and the controller 104) can be determined using a SLAM technique that considers data obtained by the sensor 112 (e.g., related to measured magnetic fields generated by the transmitter 114), information related to the magnetic fields generated by the transmitter 114, data obtained from the optical tracking devices 120, 130, and/or data obtained by the IMU 142, 144, among other data. FIG. 2 shows a schematic diagram of a SLAM distortion correction system 200 that includes, among other things, a SLAM module 210, which includes an extended Kalman filter (EKF) 220, an electromagnetic (EM) tracker 230, and a compensation algorithm 240. The EM tracker 230 may be an EMT system or may be incorporated as a component of an EMT system, such as the EMT system 100 of FIG. 1. For example, the EM tracker 230 may be configured to interact with and/or may include one or more of the components of the EMT system 100 described above with respect to FIG. 1, as described in more detail below.

The SLAM distortion correction system 200 is configured to collect one or more frames of data from the EKF 220 and the EM tracker 230 and process the data to provide a distortion model. For example, the distortion model can be determined by the compensation algorithm 240 based on the provided frames of data and other data, and the distortion model can then be used by the EM tracker 230 to compensate for the distortion (e.g., in subsequent iterations of determining the position and orientation of the HMD 102 and/or the controller 104). At the same time, the SLAM distortion correction system 200—in particular, the EKF 220—is configured to provide an estimated position and orientation (e.g., estimated pose) of the HMD 102 and/or the controller 104 based on all available data, including the distortion model when available. As each new frame of data comes in from the EKF 220 and the EM tracker 230, a new (e.g., updated) distortion model can be computed by the compensation algorithm 240 based on the latest n pieces of data, where n can be one or more depending on the particular implementation, taking into account the amount of correction needed, timing, computing power, etc.

As described above, the position and orientation of the HMD 102 and controller 104 relative to each other and/or relative to the tracking environment 106 can be determined using the EMT system 100 of FIG. 1. The SLAM distortion correction system 200 employs a similar EMT system, which includes at least the magnetic sensor 112 of the HMD 102, the magnetic transmitter 114 of the controller 104, and the EM tracker 230. The EM tracker 230 may be a computer system and/or may be a software element configured to operate and/or execute on a computer system (e.g., a separate computer system). The EM tracker 230 is configured to communicate (e.g., wirelessly communicate, for example, over a Bluetooth® connection) with the sensor 112 and the transmitter 114. For example, the EM tracker 230 is configured to cause the transmitter 114 of the controller 104 to generate magnetic fields in the manner described above. In particular, the EM tracker 230 is configured to provide instructions to the transmitter 114 to cause the transmitter 114 to generate three orthogonal sinusoidal magnetic fields having particular characteristics. In some implementations, circuitry incorporated in the controller 104 may be configured to cause the transmitter 114 to generate the magnetic fields (e.g., by driving current through the coils of the transmitter 114).

The magnetic fields generated by the transmitter 114 are sensed by the sensor 112 of the HMD 102. The sensed magnetic fields cause voltages to be induced in the coils of the sensor 112. The EM tracker 230 is configured to receive data from the sensor 112 (e.g., in the form of electrical signals representative of and/or including the induced voltages) and resolve the data into the position and orientation of the sensor 112 with respect to the transmitter 114 (e.g., the position and orientation of the HMD 102 with respect to the controller 104), or vice versa. The position and orientation of the sensor 112 and the transmitter 114 as determined by the EM tracker 230 (e.g., sometimes referred to as the EM pose) is provided to the EKF 220. As described above, the EM pose may include errors due to distortions of the magnetic fields generated by the transmitter 114 and sensed by the sensor 112. As such, the data provided to the EM tracker 230 from the sensor 112 is sometimes referred to as distorted field data. In other words, the sensor data provided to the EM tracker 230 is representative of the position and orientation of the sensor 112 based on sensed magnetic fields that may have distortions (e.g., due to presence of conductive objects in the tracking environment 106). Therefore, the sensor data provided to the EM tracker 230 may not provide the true position and orientation of the HMD 102 and/or the controller 104.

In some implementations, sensor characterization data from a sensor characterization component 202 (e.g., located at the HMD) and/or transmitter characterization data from a transmitter characterization component 204 (e.g., located at the controller 104) can also be provided to the EM tracker 230. Such characterization data can include calibration data (e.g., sensor and/or transmitter calibration data), which can be used during the determination of the position and orientation of the sensor 112 and transmitter 114. In some implementations, the transmitter characterization data includes information that the EM tracker 230 can use to correct the characteristics of the magnetic fields that are generated by the transmitter 114. Similarly, in some implementations, the sensor characterization data includes information that the EM tracker 230 can use to correct the sensor 112 response (e.g., the signals that the sensor 112 provides) to the generated magnetic fields, as described in more detail below.

Additional data is also provided to the EKF 220, which the EKF 220 can use, in addition the EM pose, to determine the estimated pose of the HMD 102 and the controller 104. For example, data from one or more optical sensors 206 can be provided to a feature extraction component 208, and the feature extraction component 208 can, among other things, determine information related to the position and/or orientation of the HMD 102 and/or the controller 104. The feature extraction component 208 provides such position and/or orientation information to the EKF 220.

In some implementations, the optical sensors 206 include one or more optical tracking devices (e.g., cameras). For example, the optical sensors 206 may include the global optical tracking device 120 and/or the local optical tracking device 130 of FIG. 1. In particular, the global optical tracking device 120 may function as a large volume tracker that is configured to track the HMD 102 and/or the controller 104 in ground truth space (e.g., by direct observation). Such ground truth data may be associated with a relatively high degree of accuracy. The local optical tracking device 130 may be used largely to receive visual (e.g., optical) data that is used by the feature extraction component 208 for landmark and/or feature detection purposes, and in some implementations, may also be used to track the HMD 102 and/or the controller 104 in ground truth space.

The feature extraction component 208 is configured to receive data (e.g., visual/optical data) from the optical sensors 206 and determine the position and/or orientation of the HMD 102 and/or the controller 104 based on such data. For example, the position of the global optical tracking device 120 (e.g., at a known location in the tracking environment 106) and the position of the local optical tracking device 130 (e.g., at the HMD 102) may be known to the feature extraction component 208. The feature extraction component 208 uses the known locations of the optical tracking devices 120, 130 as well as the visual data provided by the optical tracking devices 120, 130 to determine the position and/or orientation of the HMD 102 and/or the controller 104 (e.g., sometimes referred to as the optical pose). The feature extraction component 208 provides the optical pose to the EKF 220.

In some implementations, the functionality of the feature extraction component 208 may be incorporated into the optical sensors 206. In this way, the optical sensors 206 can both obtain visual data and process the visual data to determine the optical pose of the HMD and/or the controller 104. In such implementations, the optical sensors 206 can provide the optical pose directly to the EKF 220.

In some implementations, one or more additional sensors may also provide data to the EKF 220 that can be used to assist in position and orientation tracking of the HMD 102 and the controller 104. Examples of other sensor technologies that may provide data to the EKF 220 can include ultrasound sensors and/or radio frequency (RF) sensors (e.g., WiFi, UWB, etc.), among others.

The EKF 220 also receives inertial data from the IMU 142 of the HMD 102 and the IMU 144 of the controller 104, which the EKF 220 can use (e.g., along with the other received data described above and hereinafter) to determine the estimated pose of the HMD 102 and the controller 104. Data provided by the IMUs 142, 144 can be used to determine orientation, heading, velocity, and/or acceleration of the HMD 102 and/or the controller 104, and the determined orientation, heading, velocity, and/or acceleration can be used to determine a change in position of the HMD 102 and/or the controller 104 over time. For example, if a pose of the HMD 102 and/or the controller 104 is known based on other data (e.g., as provided by the EM tracker 230 and/or the feature extraction component 208), a subsequent pose may be determined based on the inertial data provided by the IMUs 142, 144. In some implementations, the IMUs 142, 144 may provide inertial data that has undergone additional processing to the EKF 220. For example, the IMUs 142, 144 may provide data indicative of the position and/or orientation of the HMD 102 and/or the controller 104 to the EKF 220 (e.g., rather than providing specific force, angular rate, velocity, and/or acceleration for subsequent processing). Such processed inertial data is sometimes referred to as the inertial pose.

The EKF 220 receives the EM pose from the EM tracker 230, the optical pose from the feature extraction component 208, and the inertial data/inertial pose from the IMUs 142, 144—and in some implementations, additional data from additional sensors—and computes the estimated pose of the HMD 102 with respect to the controller 104. The estimated pose is a fusion of the disparate sensor data, of which the EM pose is a single piece. As described above, in some environments, EM pose is not accurate due to distortion effects, with larger inaccuracies sometimes occurring as distances between the sensor 112 and the transmitter 114 increase. As such, the estimated pose is more accurate than the EM pose alone. The SLAM module 210 and the EKF 220 are typically software components that include algorithms configured to run on one or more computer systems. In some implementations, the SLAM module 210 and/or the EKF 220 may include one or more computing elements such as GPUs, FPGAs, etc. In some implementations, the SLAM module 210 and/or the EKF 220 may include a communications interface (e.g., a wireless communications interface) that allows the SLAM module 210 and/or the EKF 220 to communicate with one or more other computing elements and/or computing blocks.

The EKF 220 is a nonlinear version of a Kalman filter, which linearizes about an estimate of the current mean and covariance. Kalman filtering, also known as linear quadratic estimation, is an algorithm that uses a series of measurements observed over time, containing statistical noise and other inaccuracies, and provides estimates of unknown variables that tend to be more accurate than those based on a single measurement alone. The algorithm works in a two-step process. In a prediction step, the EKF 220 produces estimates of the current state variables, along with their uncertainties. Once the outcome of the next measurement (e.g., necessarily including some amount of error, including random noise) is observed, the estimates are updated using a weighted average, with more weight being given to estimates with higher certainty. The algorithm is recursive and can run in real-time using the present input measurements and the previously calculated state and its uncertainty matrix.

The EKF 220 provides the estimated pose of the HMD 102 with respect to the controller 104 to a buffer 250 that is configured to store 1 through n frames of data for the estimated pose. In the illustrated example, the buffer 250 is a first in first out (FIFO) buffer. As each new frame of estimated pose enters buffer 250 at time $t_1$, the $n^{th}$ frame of estimated pose is removed from the buffer 250, leaving the most recent n frames of estimated pose in the buffer 250. The number of frames of estimated pose, n, is typically a relatively small number (e.g., 1-3), to minimize the computational workload of the compensation algorithm 240, although in some implementations, n may be larger.

Each of the frames of estimated pose are provided to an estimated clean fields component 260. Each frame includes 3 position and 3 orientation components. The estimated clean fields component 260 also receives the sensor characterization data from the sensor characterization component 202 and the transmitter characterization data from the transmitter characterization component 204. Using the received characterization data, and based on the estimated poses received from the buffer 250, the estimated clean fields component 260 determines estimated clean magnetic fields that correspond to the respective estimated poses. In other words, the estimated clean fields component 260 considers the estimated pose and determines particular magnetic fields that, if sensed by the sensor 112, would result in the EM tracker 230 identifying the pose of the HMD 102 and the controller 104 as the estimated pose (e.g., which is more accurate than the EM pose, which typically includes errors due to distortion effects). The estimated clean fields may be determined according to techniques known to those skilled in the art, such as the techniques described in *Quaternion and Rotation Sequences*, Jack B. Kuipers, which is hereby incorporated by reference in its entirety.

The EM Tracker 230 provides the distorted fields to a buffer 270 that is configured to store 1 through n frames of data for the distorted fields. Each frame of data includes 9 magnetic field measurements. In the illustrated example, the buffer 270 is a first in first out (FIFO) buffer. As each new frame of distorted fields enters buffer 270 at time $t_1$, the $n^{th}$ frame of distorted fields is removed from the buffer 270, leaving the most recent n frames of distorted fields in the buffer 270. The number of frames of distorted fields, n, is the same as that of buffer 250, with each frame of distorted fields in the buffer 270 corresponding in time to the estimated poses stored in (or previously stored in) the buffer 250.

The buffer 250 provides the n frames of estimated pose to the compensation algorithm 240. The estimated clean fields component 260 provides n frames of estimated clean fields to the compensation algorithm 240. Each of the provided estimated clean fields correspond in time to a respective one of the n frames of estimated pose. The buffer 270 provides the n frames of distorted fields to the compensation algorithm 240.

The compensation algorithm 240 is configured to fit a distortion model to the received data and use the distortion model to predict and remove distortions. The fitting, predicting, and removal can be performed in real-time. In some implementations, the distortion model may be based on image theory, e.g., as described in US Pat. Pub. No. US2009/0048509. In some implementations, such distortion models may allow the modeling of steel pans used in concrete structures. Other models, such as a grid of rectangular loops, could model a dropped ceiling. Still other models may have the appearance of dipoles, loops, and/or spherical harmonics, as known to those skilled in the art, such as described in *Mathematical Methods for Physicists*, $4^{th}$ Edition, Arfken and Weber, which is hereby incorporated by reference in its entirety. Such models may require minimal data to construct the distortion compensation. For example, a dipole model has six parameters: position (x, y, z), orientation (azimuth, elevation), and gain. A rectangular loop model has nine parameters: position (x, y, z), orientation (azimuth, elevation, roll), length, width, and gain. Spherical harmonics have 11 or more parameters. The compensation algorithm 240 may utilize a regression technique such as a non-linear estimator to compute the distortion model, as described in more detail below.

After the compensation algorithm 240 fits the distortion model to the received data (e.g., based on the estimated pose, the distorted fields, and the estimated clean fields), the distortion model is evaluated at the present estimated pose (e.g., the frame of estimated pose at $t_1$). In particular, the distortion model is used to estimate distorted fields that are present in the tracking environment 106 at the time that corresponds to the present estimated pose. The estimated distorted fields may be caused by one or more of the various sources of distortion described above.

The compensation algorithm 240 provides the estimated distorted fields to the EM tracker 230, and the EM tracker 230 determines an improved EM pose based on the estimated distorted fields. In some implementations, the compensation algorithm 240 may provide the distortion model to the EM tracker 230, and the EM tracker 230 may estimate the distorted fields. In some examples, the EM tracker 230 considers the estimated distorted fields in determining the EM pose (e.g., a subsequent frame of EM pose). In other words, because the EM tracker 230 now has access to additional information regarding distorted fields present in the tracking environment 106 (based on the frame of estimated pose at $t_1$), the EM tracker 230 can correct future data obtained from the sensor 112 using the estimated distorted fields. Such estimated distorted fields can be compensated for in subsequently received sensor data, and the subsequent EM pose provided to the EKF 220 in a subsequent iteration may be more accurate as compared to previously provided EM poses (e.g., which may not have had the benefit of compensation by a distortion model, and/or which may have been compensated by a relatively less-refined distortion model). In some implementations, the estimated distorted fields can be subtracted from subsequently received sensor data. The improved EM pose may result in the EKF 220 providing a more accurate estimated pose for subsequent iterations, and the accuracy of the estimated pose may continue to improve with each iteration.

While the improved EM pose is provided to the EKF 220 in subsequent iterations, for each iteration, the EM tracker 230 continues to provide the distorted fields (e.g., based on the unaltered data received from the sensor 112) to the buffer 270. In other words, the field data that is provided to the buffer 270 is not corrected based on the estimated distorted fields received from the compensation algorithm 240. In this way, the distortion model may continue to be refined by the compensation algorithm 240 (e.g., based on changes of conditions in the tracking environment 106, movement of components in the tracking environment 106, etc.).

Figure 3:
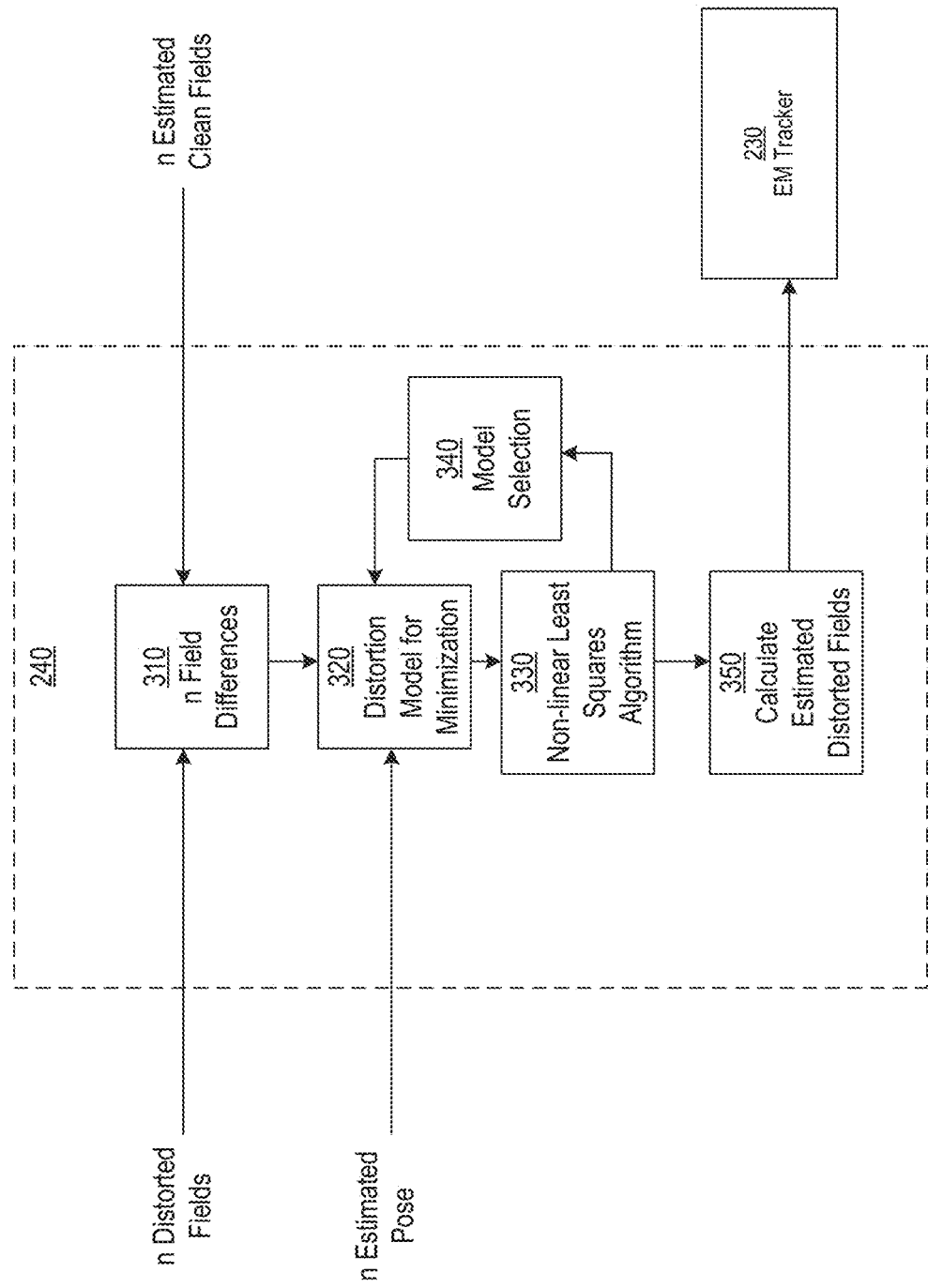
FIG. 3 shows a flowchart illustrating operations performed by the compensation algorithm of FIG. 2.

FIG. 3 shows a flowchart illustrating the operations performed by the compensation algorithm 240 of FIG. 2. The compensation algorithm 240 receives the n distorted fields from the buffer 270 and the n estimated clean fields from the estimated clean fields component 260. The received data may be in the form of 3×3 matrices that represent the three induced voltages from the sensor 112 due to the three excitations of the coils of the transmitter 114. Differences between respective ones of the n sets of 3×3 matrices are taken (e.g., n fields differences 310 are taken) to provide n estimated sets of distortion data. The distortion data represents the distortion caused by the tracking environment 106. The compensation algorithm 240 receives the n estimated poses and the n estimated sets of distortion data, and a distortion model for minimization 320 incorporates then estimated poses and then estimated sets of distortion data into a distortion model formulation. The distortion model may be any one of many, such as one of the distortion models described above (e.g., dipole, loop, spherical harmonic, etc.). In some implementations, a fixed distortion model is used. In some implementations, the distortion model may be adjusted depending on how well the distortion model fits the distortion data. In some implementations, multiple distortion models may be used.

A non-linear least squares algorithm 330 uses the distortion model and the distortion data to determine a best fit to the model parameters. In some implementations, the non-linear least squares algorithm 330 may be a Levenberg-Marquardt (LM) type. The non-linear least squares algorithm 330 may require that the number of parameters of the particular distortion model being used is less than or equal to the number of sets of data (e.g., n). For each set of data, there are nine elements of data. Therefore, both a dipole and a rectangular loop model could be used for the distortion model. Additional (e.g., consistent) data may yield an over-determined solution and typically yields better results. As such, with n=3, there are 27 elements of data, which can fit a single complex model (e.g., a spherical harmonic) or multiple simpler models (e.g., dipole, loop).

Model selection 340 is performed based on the best fit to the model parameters provided by the non-linear least squares algorithm 330. The model selection 340 may be used to select or evaluate various pre-defined distortion models. In particular, the non-linear least squares algorithm 330 generates a goodness of fit value (e.g., at the conclusion of its parameter computation). The goodness of fit can be used to evaluate the distortion model's capability to fit the distortion. Multiple models may be compared by the model selection 340, and the best model may be selected for use. In some implementations, models of increasing complexity may be slowly introduced (e.g., in series) until the goodness of fit meets a predetermined threshold (e.g., a threshold value) or until potential models are exhausted. The model selection 340 may be used to determine global models as time goes on. For example, by keeping track of models that are accepted for use, the model selection 340 can evaluate model history and determine whether other (e.g., additional) global models are available.

Once the particular distortion model is selected and the model parameters are identified by the non-linear least squares algorithm 330, the model parameters are used to calculate the estimated distorted fields 350 (e.g., as caused by environmental distortion). The estimated distorted fields are calculated by evaluating the distortion model and its parameters at the estimated pose that corresponds to $t_1$. The compensation algorithm 240 provides the estimated distorted fields to the EM tracker 230, as described above with respect to FIG. 2. The estimated distorted fields is provided as a set of nine values (e.g., a 3×3 matrix), where it is subtracted from a subsequent reading from the sensor 112 before processing to yield an improved EM pose. The process can repeat, thereby continuing to provide improved EM poses with increased accuracy.

Referring again to FIG. 2, in some implementations, one or more types of data may be unavailable to the EKF 220. In such circumstances, the EKF 220 continues to provide estimated poses according to the available data. For example, in some implementations, the HMD 102 and/or the controller 104 may not be visible to the optical sensors 206. As such, an optical pose may not be provided to the EKF 220 for a period of time. Nonetheless, the EKF 220 can continue to provide estimated poses based on the data provided by the EM tracker 230 and/or the data provided by the IMUs 142, 144. In some implementations, the EKF 220 can provide estimates of velocity and/or acceleration of the estimated poses, and such estimates can allow the EKF 220 to extrapolate future estimated poses. Using such extrapolated future estimated poses, the distorted fields can still be compensated for to some degree.

Figure 4:
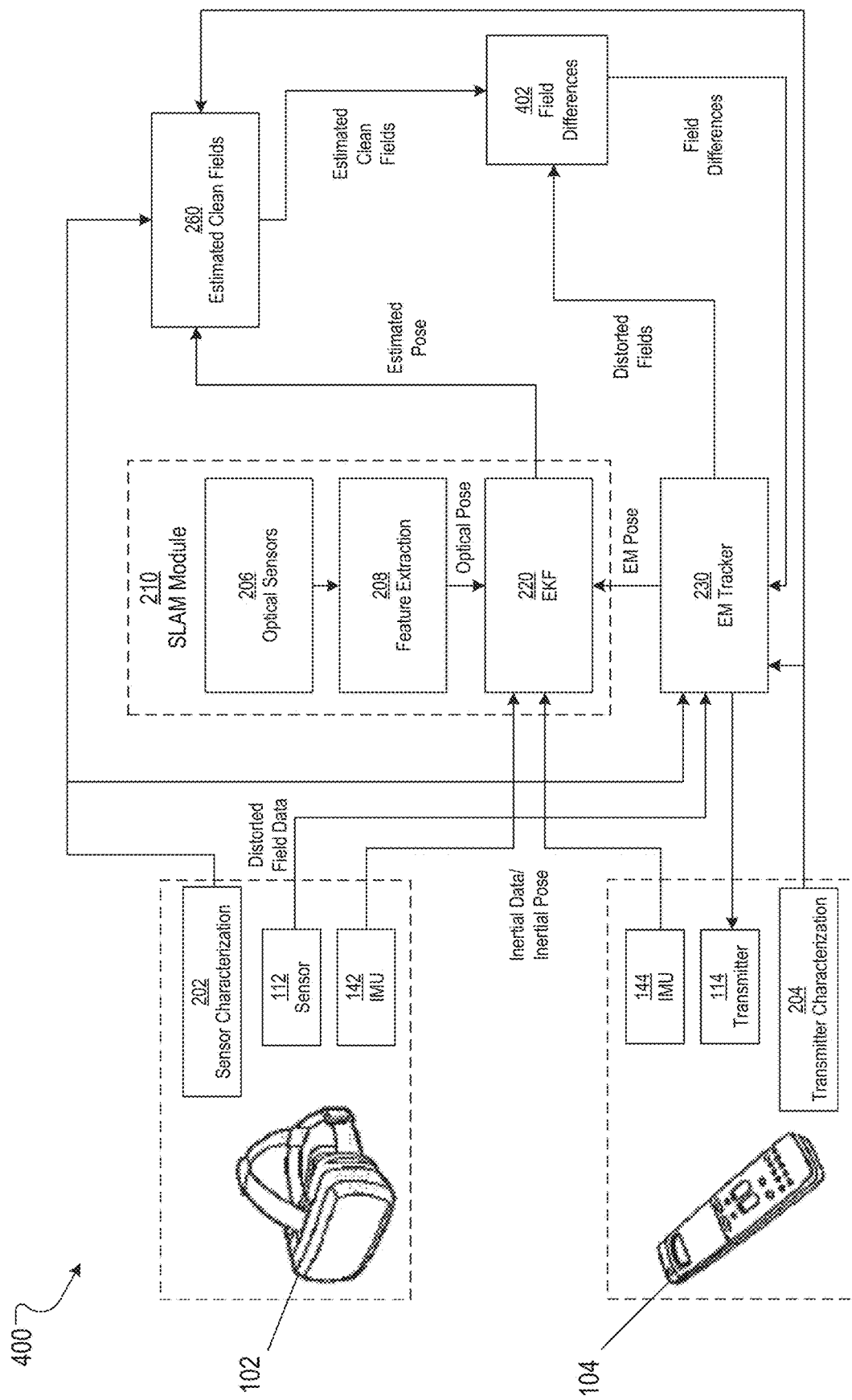
FIG. 4 shows a schematic diagram of another example of a SLAM distortion correction system.

FIG. 4 shows a schematic diagram of another example of a SLAM distortion correction system 400. The SLAM distortion correction system 400 may be similar to the SLAM distortion correction system 200 of FIG. 2. In the example illustrated in FIG. 4, a fields differences component 402 is provided in place of the compensation algorithm 240. Further, buffers 250, 270 are omitted in the example illustrated in FIG. 4, although in some implementations, one or more buffers may be provided.

The SLAM distortion correction system 400 of FIG. 4 may use data from the EKF 220 and the estimated clean fields component 260 as-is (e.g., without computing a distortion model and estimating distorted fields). As such, no additional processing of the data may be required. In some implementations, the SLAM distortion correction system 400 may require fresh data for each frame to derive the field differences. For example, because such implementations do not include distortion models, there exists less history to draw on.

The fields differences component 402 is configured to receive the estimated clean fields from the estimated clean fields component 260 and distorted fields from the EM tracker 230. The received data may be in the form of 3×3 matrices that represent the three induced voltages from the sensor 112 due to the three excitations of the coils of the transmitter 114. Differences between the estimated clean fields and the distorted fields are calculated. The differences represent the distortion caused by the tracking environment 106.

The field differences component 402 provides the field differences to the EM tracker 230, and the EM tracker 230 determines an improved EM pose (e.g., a subsequent frame of EM pose) based on the field differences. For example, the field differences that are provided to the EM tracker 230 represent error that exists between the estimated clean fields that correspond to the estimated pose (e.g., as determined by the EKF 220) and the distorted fields initially provided by the EM tracker 230. The field differences can be subtracted from future distorted field data received from the sensor 112 to compensate for the effects of distortion. The subsequent EM pose provided to the EKF 220 in a subsequent iteration may be more accurate as compared to previously provided EM poses (e.g., which may not have had the benefit of compensation by the field differences component 402). The improved EM pose may result in the EKF 220 providing a more accurate estimated pose for subsequent iterations, and the accuracy of the estimated pose may continue to improve with each iteration. While the improved EM pose is provided to the EKF 220 in subsequent iterations, the EM tracker 230 continues to provide the distorted fields (e.g., based on the unaltered data received from the sensor 112) to the field differences component 402. In other words, the field data that is provided to the field differences component 402 is not corrected based on the field differences received from the field differences component 402.

The EM tracker 230 described with respect to FIGS. 2 and 4 is provided as a separate component from the EKF 220. Such implementations of the SLAM module 210 are sometimes referred to as loosely coupled. In general, a loosely coupled fusion of sensors and processing components relies on taking disparate processed sensor outputs from sensors (or sensor modalities) and attempting to form a composite solution to the sensing problem. In the context of the EM tracker 230 being provided separate from the EKF 220, the EM tracker 230 receives readings from the sensor 112 (e.g., raw sensor readings), resolves the sensor readings into position and orientation data (e.g., EM pose), and provides the position and orientation data to the EKF 220, where it is processed along with other data to provide an estimated pose. In a tightly coupled system, disparate raw outputs of the sensor 112 are provided to the EKF 220. In this way, the functionality of the EM tracker 230 may be incorporated into the EKF 220. The EKF 220 can form the solution (e.g., estimated pose) based on all sensor outputs, as described in more detail below.

Other sensor modalities can also be implemented in a tightly coupled manner. For example, rather than the outputs from the optical sensor 206 being resolved into optical pose and the optical pose being provided to the EKF 220, disparate raw outputs from the optical sensors 206 may be provided to the EKF 220, and the raw outputs from the optical sensors 206 can be used by the EKF 220 in determining the estimated pose. Similarly, rather than the IMUs 142, 144 of the HMD 102 and the controller 104 providing inertial pose to the EKF 220, the IMUs 142, 144 can provide disparate raw outputs of inertial data (e.g., inertial raw data) to the EKF, and the raw outputs from the IMUs 142, 144 can be used by the EKF 220 in determining the estimated pose.

In some implementations, models of one or more components are incorporated into the EKF 220. For example, a model corresponding to the EM tracker 230, a model corresponding to the optical sensors 206, and/or a model corresponding to the IMUs 142, 144 may be incorporated into the EKF 220. Such models can be used to ultimately provide the estimated pose based on the disparate raw sensor outputs. Feedback in a tightly coupled system is internal to the EKF 220 and can be used to correct one or more sensing deficiencies (e.g., such as bias of the IMUs 142, 144, etc.). One advantage of a tightly coupled system is that a bandwidth of the system can be reduced, which in turn increases the signal-to-noise ratio (SNR) of the system. Tightly coupled systems are typically also harder to disrupt, because all the raw sensor data is integrated into one (e.g., single) process of the EKF 220. In general, tightly coupled systems can improve performance in the presence of distortion because some sensors can help compensate for deficiencies of other sensors (e.g., some sensors can help take up the slack). For example, when EM tracking becomes unreliable, data from the optical sensors 206 and/or the IMUs 142, 144 can largely be used to resolve the estimated pose; when optical tracking becomes unreliable (e.g., due to the HMD 102 or the controller 104 not being visible), data from the sensor 112 and/or the IMUs 142, 144 can largely be used to resolve the estimated pose. In some implementations, more filter states are observable in tightly coupled systems, and as such, the filter can provide more stable outputs.

Tightly and loosely coupled fusion are sometimes not clearly delineated. For example, a variety of implementations are possible, from all loosely coupled, where every input to the EKF 220 is from a standalone device, to a full tightly coupled system, where all sensors provide raw outputs to the EKF 220. Depending on the particular implementation and particular design choices/constraints, some sensors may be more or less coupled than others.

While some distortion compensation techniques have been described with respect to FIGS. 2 and 4, other distortion compensation techniques are also possible instead of or in addition to those described above. The particular distortion compensation technique employed may depend on the type of application (e.g., AR/VR/MR), processing power constraints (e.g., in terms of actual power consumption and/or hardware/firmware capabilities), and accuracy requirements. In some implementations, one or both of pose corrections or field corrections can be used to perform the compensation. In other words, the compensation technique may provide field corrections that are used to provide an improved EM pose for subsequent iterations, and/or the compensation technique may provide pose corrections that are used to provide an improved EM pose. Whether pose corrections or field corrections are used may depend on the coupling nature of the system (e.g., whether the particular implementation of the system is tightly coupled, loosely coupled, or somewhere in between).

In some implementations, the distortion compensation technique may provide a real-time map of the HMD 102, the controller 104, and the tracking environment 106. To characterize the tracking environment 106, one may need to keep track of the pose of the transmitter 114, the pose of the sensor 112, and the distortion that exists at each pose. Each time the transmitter 114 changes pose, a new coupling to the distorters occurs. A map may require approximately 12 input coordinates to fulfill the requirements of the system. The input coordinates may include position and orientation of the transmitter 114 and position and orientation of the sensor 112 with respect to the transmitter 114. The output of the map can either be field corrections or pose corrections such that the field or pose corresponds to non-distorted data. Such mapping can be performed by scattered data interpolation methods, neural networks, multilevel interpolation, etc. In some implementations, the compensation technique may operate with minimal delay (e.g., less than 20 milliseconds) and allow for relatively high updates rates (e.g., greater than 60 updates per second).

In some implementations, scattered data interpolation methods, such as radial basis functions (RBFs) for either pose or fields, can be constructed (e.g., sparsely constructed), thereby limiting the amount of data needed for compensation. Scattered data can be managed such that a sparse data collection occurs over the tracking environment 106. The collection and acceptance of mapping points may be controlled by one or more processing components corresponding to the distortion compensation technique employed. In some implementations, the processing components can also be configured to cause mapping points to be added or deleted, as appropriate, to improve the map. The amount of data collected for the map may be limited such that corrections can be computed in real-time. In some implementations, feedback related to the adequacy of the mapping data may be provided by the EKF 220. In some implementations, neural networks and/or deep learning algorithms can be configured to learn the distortion compensation.

In some implementations, the distortion compensation technique may involve running the EM components (e.g., the sensor 112, the transmitter 114, etc.) at multiple frequencies (e.g., two frequencies) to detect differences in the performance of the EM tracker 230. In some implementations, the distortion compensation technique may consider phase shifts or system response over a frequency range. Such techniques may determine differences in frequency response between somewhat ideal and distorted pose or fields and use such differences to correct the EM pose provided by the EM tracker 230. A map of such corrections can be used as described above.

In some implementations, the distortion compensation approach incorporated into the system can use two or more of the distortion compensation techniques described above. For example, multilevel combinations of the techniques described above can be combined such that global corrections and/or finer detail corrections can occur at different scales. One or more image planes could be used for coarse correction, and RBFs and/or neural networks could be used for finer corrections.

In some implementations, the distortion compensation technique may use fading memory that contains the previous few frames of data to construct the compensation. The position, velocity, and/or acceleration of the sensor 112 and/or the transmitter 114 are known with respect to each other from the EKF 220. If the previous few frames of data have compensation data available, then the compensation data can be extrapolated forward using curve fitting techniques. If no compensation data is available, then the last few frames of data can be used to compute a compensation on the fly, as described above (e.g., with respect to the distortion models of FIG. 2 and the field differences of FIG. 4).

In some implementations, the distortion compensation techniques may be performed at system start up and improved over time. In some implementations, the compensation techniques may be performed when first entering a new environment (e.g., as a calibration routine). In some implementations, compensation information can be saved by the system for various environments such that the compensation information can be reused.

In some implementations, one or more components (e.g., processing components) corresponding to the one or more distortion compensation techniques employed may be incorporated into the EKF 220 itself, or functionality of the one or more distortion compensation techniques employed may be incorporated into software corresponding to the EKF 220. In this way, the distortion compensation processes may be contained within the EKF 220 or elsewhere in the SLAM module 210.

In some implementations, the EKF 220 may generate an error covariance matrix that provides information related to how well the particular compensation model fits. The error covariance matrix can be used to determine residual model errors. The residual model errors can be evaluated such that a decision is made as to the quality of the overall tracking solution (e.g., the estimated pose). If the quality of the estimated pose is not satisfactory (e.g., if a goodness of fit does not meet a predetermined threshold), The EKF 220 may perform another iteration to generate an updated estimated pose, thereby repeating the process. On the other hand, if the quality of the estimated pose is satisfactory, the process continues.

As described above, the various distortion compensation techniques includes functionality to evaluate the quality of solutions (e.g., goodness of fit). Because of the integration of the EM tracker 230 with the EKF 220 (e.g., in tightly coupled implementations), an indication of the accuracy of the EM tracker 230 as compared to the overall system is available. The indication of the accuracy of the EM tracker 230 as compared to the overall system can be used to provide a quality of EM solution indicator by mapping residual model errors into a user output such that the user knows when the accuracy of the EM tracker 230 is degraded.

Figure 5:
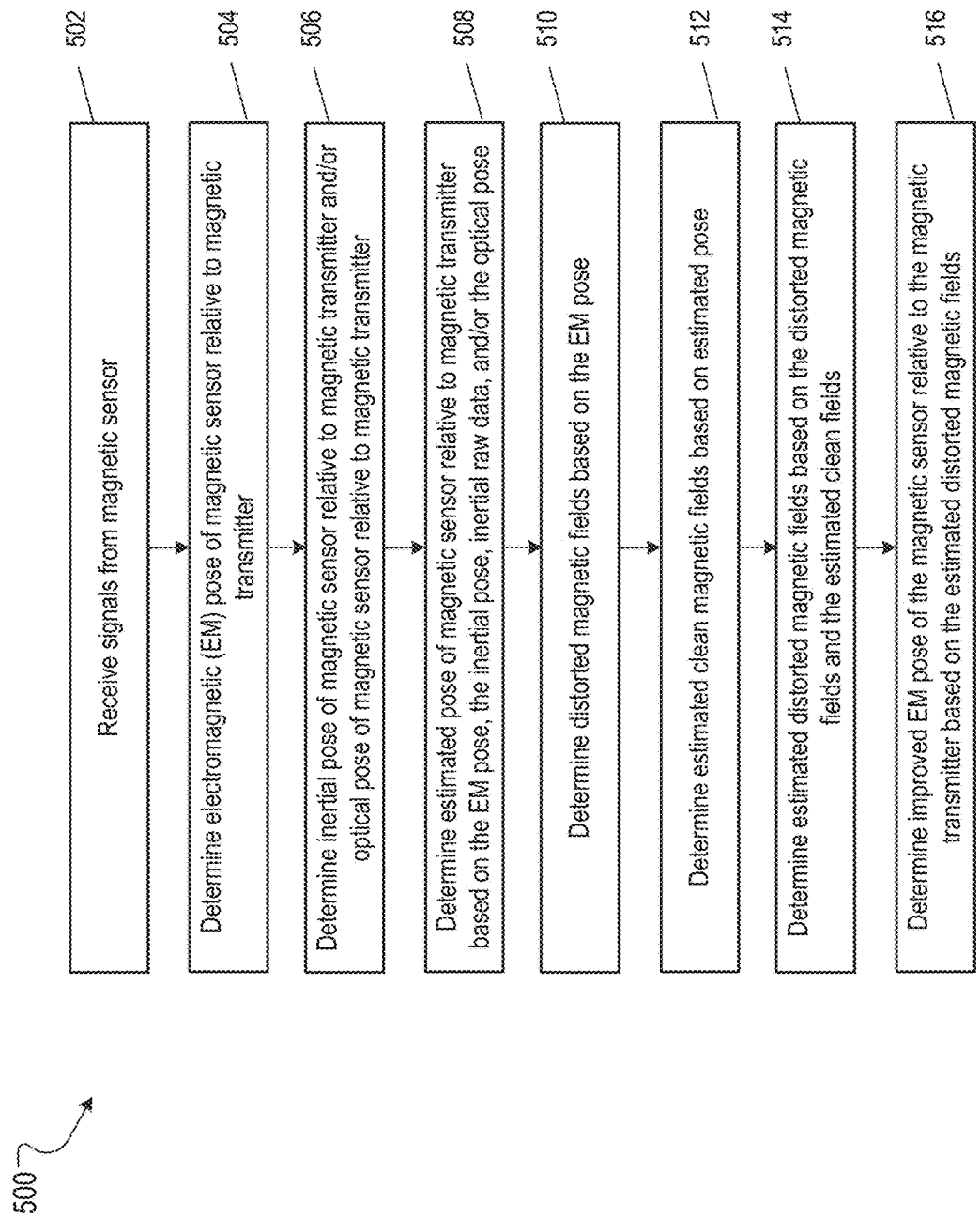
FIG. 5 shows a flowchart of an exemplary process of determining an estimated pose and an improved EM pose of a magnetic sensor relative to a magnetic transmitter

FIG. 5 is a flowchart of an exemplary process 500 of determining an estimated pose and an improved EM pose of a magnetic sensor relative to a magnetic transmitter (e.g., the magnetic sensor 112 and the magnetic transmitter 114 of FIGS. 1, 2, and 4).

At step 502, signals are received from a magnetic sensor. For example, a magnetic transmitter is configured to generate magnetic fields, and the magnetic sensor is configured to respond to the signals based on characteristics of the magnetic fields that are received at the magnetic sensor. The magnetic fields generated by the magnetic transmitter may be three orthogonal sinusoidal magnetic fields having one or more particular frequencies. The signals may be received by one or more computer systems.

At step 504, an electromagnetic (EM) pose of the magnetic sensor relative to the magnetic transmitter is determined based on the signals received from the magnetic sensor. For example, the signals received from the magnetic sensor may be resolved into the position and orientation of the magnetic sensor with respect to the magnetic transmitter (e.g., the position and orientation of a HMD in which the magnetic sensor is incorporated with respect to a controller in which the magnetic transmitter is incorporated), or vice versa. The EM pose may include errors (e.g., positional and/or orientational errors) for example due to distortions of the magnetic fields generated by the magnetic transmitter and sensed by the magnetic sensor.

In some implementations (e.g., in systems that include one or more loosely coupled aspects), the EM pose may be determined by an EM tracker. For example, the EM tracker may receive the signals from the magnetic sensor and determine the EM pose based on the received signals and the sensor and transmitter characterization data. The EM tracker may then provide the EM pose to the EKF, as described herein.

In some implementations (e.g., in systems that include one or more tightly coupled aspects), the magnetic sensor may provide the signals to the EKF, and the EKF may determine the EM pose. In this way, the EKF may include functionality for converting disparate raw outputs from the magnetic sensor into the EM pose.

At step 506, an inertial pose of the magnetic sensor relative to the magnetic transmitter is determined based on inertial data associated with the magnetic transmitter and the magnetic transmitter and/or an optical pose of the magnetic sensor relative to the magnetic transmitter is determined based on optical data associated with the magnetic transmitter and the magnetic sensor.

In some implementations, inertia data may be received from an IMU associated with the magnetic sensor and an IMU associated with the magnetic transmitter (e.g., IMUs incorporated into the HMD and the controller). The inertial data can be used to determine a pose of the magnetic sensor relative to the magnetic transmitter. The determined pose based on the inertial data is referred to herein as the inertial pose. In some implementations, the inertial data may be provided to a separate component, and the separate component may determine the inertial pose based on the inertial data.

In some implementations, inertia data may be received from an IMU associated with the magnetic sensor and an IMU associated with the magnetic transmitter (e.g., IMUs incorporated into the HMD and the controller). The inertial data can be used to measure specific force and/or angular rate, which can be used to determine one or more of a velocity and/or acceleration of the IMU (or an object in which the IMU is incorporated), its orientation and its heading. The determined velocity and/or acceleration can be used to determine a change in position of the IMU over time. Such inertial data is referred to herein as the inertial raw data.

In some implementations, visual/optical data is obtained by one or more optical sensors (e.g., cameras) and the data is used to determine a position and orientation of the magnetic sensor relative to the magnetic transmitter. The one or more optical sensors may include a large volume tracker that is configured to track the HMD and the controller in ground truth space. The determined pose based on the optical data is referred to herein as the optical pose.

At step 508, an estimated pose of the magnetic sensor relative to the magnetic transmitter is determined based on the EM pose and the inertial pose and/or inertial raw data and/or the optical pose. For example, a Kalman filter (e.g., an extended Kalman filter (EKF)) may determine the estimated pose based on the EM pose and the inertial pose and/or inertial raw data and/or the optical pose. The estimated pose is an estimate of the position and orientation of the magnetic sensor relative to the magnetic transmitter based on all available data. In other words, the estimated pose is a fusion of the disparate sensor data, of which the EM pose is a single piece. Due to the potential presence of distortions in the tracking environment, the estimated pose is typically more accurate than the EM pose alone.

At step 510, distorted magnetic fields are determined based on the EM pose. For example, the data that is received from the magnetic sensor is used to determine the distorted magnetic fields. Because the EM pose may include errors due to distortions of the magnetic fields generated by the magnetic transmitter and sensed by the magnetic sensor, the data provided by the magnetic sensor is sometimes referred to as distorted field data. The distorted field data, which is representative of the EM pose of the magnetic sensor relative to the magnetic transmitter, can be considered along with sensor and transmitter characterization data to determine the distorted magnetic fields (e.g., the magnetic fields, including distortions, as sensed by the magnetic sensor).

At step 512, estimated clean magnetic fields are determined based on the estimated pose. For example, because the estimated pose is an estimate of the position and orientation of the magnetic sensor relative to the magnetic transmitter based on all available data (e.g., a fusion of the disparate sensor data), it is typically more accurate than the EM pose. The estimated pose, along with the sensor and transmitter characterization data, are used to determine estimated clean magnetic fields that correspond to the estimated pose. In other words, the estimated clean magnetic fields are determined as being those that, if sensed by the magnetic sensor, would result in the magnetic sensor providing signals representative of the estimated pose of the magnetic sensor relative to the magnetic transmitter.

At step 514, estimated distorted magnetic fields are determined based on the distorted magnetic fields and the estimated clean magnetic fields. In some implementations, the estimated distorted magnetic fields are calculated by taking the difference between the estimated clean magnetic fields and the distorted magnetic fields. In this way, the differences represent the distortion caused by the tracking environment.

In some implementations, a compensation algorithm is configured to fit a distortion model to the distorted magnetic fields, the estimated clean magnetic fields, and the estimated pose, and use the distortion model to predict and remove distortions. In some examples, after the distortion model is fit to the received data, the distortion model can be evaluated at the present estimated pose. In particular, the distortion model can be used to determine the estimated distorted magnetic fields that are present in the tracking environment at the time that corresponds to the estimated pose. The estimated distorted magnetic fields may be caused by one or more sources of distortion present in the tracking environment. In some implementations, the estimated distorted magnetic fields are determined according to a compensation algorithm (e.g., which can employ a non-linear least squares algorithm). In some implementations, the distortion model includes one or more of a dipole model, a rectangular loop model, or a spherical harmonics model.

At step 516, an improved EM pose of the magnetic sensor relative to the magnetic transmitter is determined based on the estimated distorted magnetic fields. For example, for a next iteration of determining the pose of the magnetic sensor relative to the magnetic transmitter, an improved EM pose is determined. The improved EM pose is improved relative to the previously determined EM pose in the sense that the improved EM pose considers the estimated distorted magnetic fields in determining the position and orientation of the magnetic sensor relative to the magnetic transmitter. For example, the signals received from the magnetic sensor for the next iteration are expected to include errors due to distortions in the tracking environment. However, the estimated distorted magnetic fields are now available, as determined in the previous iteration. Therefore, the estimated distorted magnetic fields are compensated for in the next iteration, and the improved EM pose is determined. Continuing with the next iteration, the improved EM pose can be considered in determining a next iteration of the estimated pose, which in turn has improved accuracy due to the improved accuracy of the improved EM pose. Note, however, that when determining the distorted magnetic fields in the next iteration (e.g., the next iteration of step 510), the non-improved data (e.g., the non-improved EM pose) is used. In other words, for determining the distorted magnetic fields in future iterations, the unaltered data received from the magnetic sensor is used (e.g., the EM pose represented by the sensor data is not corrected based on the estimated distorted magnetic fields when determining the distorted magnetic fields).

Figure 6:
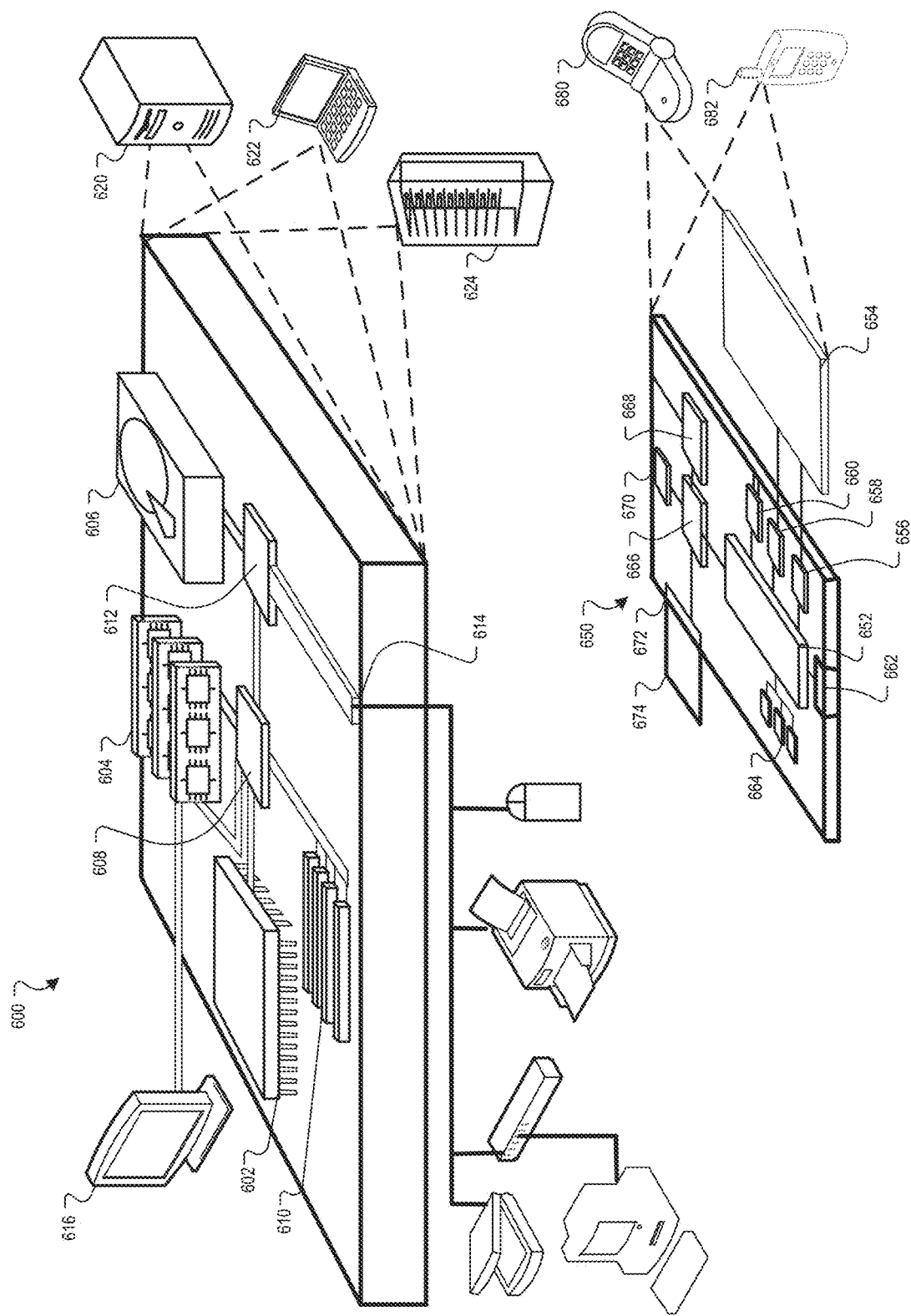
FIG. 6 shows an example of a computing device and a mobile computing device that can be used to implement the techniques described herein.

As described above, the AR/VR system and/or the EMT system 100 can be operated using software executed by a computing device. The software can include executable code for performing one or more of the functions described above with respect to FIGS. 1-5. In some implementations, the software is included on a computer-readable medium for execution on a computer system. FIG. 6 shows an example computing device 600 and an example mobile computing device 650 (e.g., computer systems), which can be used to implement the techniques described herein. For example, the EM tracker 230, the distortion compensation techniques, etc. may be controlled by the computing device 600 and/or the mobile computing device 650. Computing device 600 is intended to represent various forms of digital computers, including, e.g., laptops, desktops, workstations, personal digital assistants, servers, blade servers, mainframes, and other appropriate computers. Computing device 650 is intended to represent various forms of mobile devices, including, e.g., personal digital assistants, cellular telephones, smartphones, and other similar computing devices. The components shown here, their connections and relationships, and their functions, are meant to be examples only, and are not meant to limit implementations of the techniques described and/or claimed in this document.

Computing device 600 includes processor 602, memory 604, storage device 606, high-speed interface 608 connecting to memory 604 and high-speed expansion ports 610, and low speed interface 612 connecting to low speed bus 614 and storage device 606. Each of components 602, 604, 606, 608, 610, and 612, are interconnected using various busses, and can be mounted on a common motherboard or in other manners as appropriate. Processor 602 can process instructions for execution within computing device 600, including instructions stored in memory 604 or on storage device 606, to display graphical data for a GUI on an external input/output device, including, e.g., display 616 coupled to high-speed interface 608. In some implementations, multiple processors and/or multiple buses can be used, as appropriate, along with multiple memories and types of memory. In addition, multiple computing devices 600 can be connected, with each device providing portions of the necessary operations (e.g., as a server bank, a group of blade servers, a multi-processor system, etc.).

Memory 604 stores data within computing device 600. In some implementations, memory 604 is a volatile memory unit or units. In some implementation, memory 604 is a non-volatile memory unit or units. Memory 604 also can be another form of computer-readable medium, including, e.g., a magnetic or optical disk.

Storage device 606 is capable of providing mass storage for computing device 600. In some implementations, storage device 606 can be or contain a computer-readable medium, including, e.g., a floppy disk device, a hard disk device, an optical disk device, a tape device, a flash memory or other similar solid state memory device, or an array of devices, including devices in a storage area network or other configurations. A computer program product can be tangibly embodied in a data carrier. The computer program product also can contain instructions that, when executed, perform one or more methods, including, e.g., those described above. The data carrier is a computer- or machine-readable medium, including, e.g., memory 604, storage device 606, memory on processor 602, and the like.

High-speed controller 608 manages bandwidth-intensive operations for computing device 600, while low speed controller 612 manages lower bandwidth-intensive operations. Such allocation of functions is an example only. In some implementations, high-speed controller 608 is coupled to memory 604, display 616 (e.g., through a graphics processor or accelerator), and to high-speed expansion ports 610, which can accept various expansion cards (not shown). In some implementations, the low-speed controller 612 is coupled to storage device 606 and low-speed expansion port 614. The low-speed expansion port, which can include various communication ports (e.g., USB, Bluetooth®, Ethernet, wireless Ethernet), can be coupled to one or more input/output devices, including, e.g., a keyboard, a pointing device, a scanner, or a networking device including, e.g., a switch or router (e.g., through a network adapter).

Computing device 600 can be implemented in a number of different forms, as shown in FIG. 6. For example, the computing device 600 can be implemented as standard server 620, or multiple times in a group of such servers. The computing device 600 can also can be implemented as part of rack server system 624. In addition or as an alternative, the computing device 600 can be implemented in a personal computer (e.g., laptop computer 622). In some examples, components from computing device 600 can be combined with other components in a mobile device (e.g., the mobile computing device 650). Each of such devices can contain one or more of computing device 600, 650, and an entire system can be made up of multiple computing devices 600, 650 communicating with each other.

Computing device 650 includes processor 652, memory 664, and an input/output device including, e.g., display 654, communication interface 666, and transceiver 668, among other components. Device 650 also can be provided with a storage device, including, e.g., a microdrive or other device, to provide additional storage. Components 650, 652, 664, 654, 666, and 668, may each be interconnected using various buses, and several of the components can be mounted on a common motherboard or in other manners as appropriate.

Processor 652 can execute instructions within computing device 650, including instructions stored in memory 664. The processor 652 can be implemented as a chipset of chips that include separate and multiple analog and digital processors. The processor 652 can provide, for example, for the coordination of the other components of device 650, including, e.g., control of user interfaces, applications run by device 650, and wireless communication by device 650.

Processor 652 can communicate with a user through control interface 658 and display interface 656 coupled to display 654. Display 654 can be, for example, a TFT LCD (Thin-Film-Transistor Liquid Crystal Display) or an OLED (Organic Light Emitting Diode) display, or other appropriate display technology. Display interface 656 can comprise appropriate circuitry for driving display 654 to present graphical and other data to a user. Control interface 658 can receive commands from a user and convert them for submission to processor 652. In addition, external interface 662 can communicate with processor 642, so as to enable near area communication of device 650 with other devices. External interface 662 can provide, for example, for wired communication in some implementations, or for wireless communication in some implementations. Multiple interfaces also can be used.

Memory 664 stores data within computing device 650. Memory 664 can be implemented as one or more of a computer-readable medium or media, a volatile memory unit or units, or a non-volatile memory unit or units. Expansion memory 674 also can be provided and connected to device 650 through expansion interface 672, which can include, for example, a SIMM (Single In Line Memory Module) card interface. Such expansion memory 674 can provide extra storage space for device 650, and/or may store applications or other data for device 650. Specifically, expansion memory 674 can also include instructions to carry out or supplement the processes described above and can include secure data. Thus, for example, expansion memory 674 can be provided as a security module for device 650 and can be programmed with instructions that permit secure use of device 650. In addition, secure applications can be provided through the SIMM cards, along with additional data, including, e.g., placing identifying data on the SIMM card in a non-hackable manner.

The memory 664 can include, for example, flash memory and/or NVRAM memory, as discussed below. In some implementations, a computer program product is tangibly embodied in a data carrier. The computer program product contains instructions that, when executed, perform one or more methods, including, e.g., those described above with respect to compensating for distortion. The data carrier is a computer- or machine-readable medium, including, e.g., memory 664, expansion memory 674, and/or memory on processor 652, which can be received, for example, over transceiver 668 or external interface 662.

Device 650 can communicate wirelessly through communication interface 666, which can include digital signal processing circuitry where necessary. Communication interface 666 can provide for communications under various modes or protocols, including, e.g., GSM voice calls, SMS, EMS, or MMS messaging, CDMA, TDMA, PDC, WCDMA, CDMA2000, or GPRS, among others. Such communication can occur, for example, through radio-frequency transceiver 668. In addition, short-range communication can occur, including, e.g., using a Bluetooth®, WiFi, or other such transceiver (not shown). In addition, GPS (Global Positioning System) receiver module 670 can provide additional navigation- and location-related wireless data to device 650, which can be used as appropriate by applications running on device 650.

Device 650 also can communicate audibly using audio codec 660, which can receive spoken data from a user and convert it to usable digital data. Audio codec 660 can likewise generate audible sound for a user, including, e.g., through a speaker, e.g., in a handset of device 650. Such sound can include sound from voice telephone calls, recorded sound (e.g., voice messages, music files, and the like) and also sound generated by applications operating on device 650.

Computing device 650 can be implemented in a number of different forms, as shown in FIG. 6. For example, the computing device 650 can be implemented as cellular telephone 680. The computing device 650 also can be implemented as part of smartphone 682, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include one or more computer programs that are executable and/or interpretable on a programmable system. This includes at least one programmable processor, which can be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms machine-readable medium and computer-readable medium refer to a computer program product, apparatus and/or device (e.g., magnetic discs, optical disks, memory, Programmable Logic Devices (PLDs)) used to provide machine instructions and/or data to a programmable processor, including a machine-readable medium that receives machine instructions.

To provide for interaction with a user, the systems and techniques described herein can be implemented on a computer having a display device (e.g., a CRT (cathode ray tube) or LCD (liquid crystal display) monitor) for presenting data to the user, and a keyboard and a pointing device (e.g., a mouse or a trackball) by which the user can provide input to the computer. Other kinds of devices can be used to provide for interaction with a user as well. For example, feedback provided to the user can be a form of sensory feedback (e.g., visual feedback, auditory feedback, or tactile feedback). Input from the user can be received in a form, including acoustic, speech, or tactile input.

The systems and techniques described here can be implemented in a computing system that includes a backend component (e.g., as a data server), or that includes a middleware component (e.g., an application server), or that includes a frontend component (e.g., a client computer having a user interface or a Web browser through which a user can interact with an implementation of the systems and techniques described here), or a combination of such backend, middleware, or frontend components. The components of the system can be interconnected by a form or medium of digital data communication (e.g., a communication network). Examples of communication networks include a local area network (LAN), a wide area network (WAN), and the Internet.

The computing system can include clients and servers. A client and server are generally remote from each other and typically interact through a communication network. The relationship of client and server arises by virtue of computer programs running on the respective computers and having a client-server relationship to each other.

In some implementations, the components described herein can be separated, combined or incorporated into a single or combined component. The components depicted in the figures are not intended to limit the systems described herein to the software architectures shown in the figures.

A number of embodiments have been described. Nevertheless, it will be understood that various modifications may be made without departing from the spirit and scope of the disclosure. Accordingly, other embodiments are within the scope of the following claims.

What is claimed is:

1. A system comprising:
a magnetic transmitter configured to generate magnetic fields;
a magnetic sensor configured to generate signals based on characteristics of the magnetic fields received at the magnetic sensor; and
one or more computer systems configured to:
receive the signals from the magnetic sensor;
determine, by an electromagnetic (EM) tracker, based on the signals received from the magnetic sensor, an EM pose of the magnetic sensor relative to the magnetic transmitter;
determine one or both of: i) an inertial pose of the magnetic sensor relative to the magnetic transmitter based on inertial data from an inertial measurement unit (IMU) associated with the magnetic transmitter and the magnetic sensor, or ii) an optical pose of the magnetic sensor relative to the magnetic transmitter based on optical data from an optical sensor associated with the magnetic transmitter and the magnetic sensor;
determine an estimated pose of the magnetic sensor relative to the magnetic transmitter based on the EM pose and the one or both of the inertial pose or the optical pose;
determine distorted magnetic fields based on the EM pose;
determine estimated clean magnetic field values based on the estimated pose;
determine estimated distorted magnetic field values based on differences between the distorted magnetic fields and the estimated clean fields; and
determine an improved EM pose of the magnetic sensor relative to the magnetic transmitter based on the estimated distorted magnetic fields.

2. The system of claim 1, wherein the estimated distorted magnetic fields are determined according to a compensation algorithm.

3. The system of claim 2, wherein the compensation algorithm is configured to:
select a distortion model based on the distorted magnetic fields, the estimated clean magnetic fields, and the estimated pose;
identify parameters of the model using a non-linear least squares algorithm; and
calculate the estimated distorted magnetic fields based on the identified parameters.

4. The system of claim 3, wherein the distortion model includes one or more of a dipole model, a rectangular loop model, or a spherical harmonics model.

5. The system of claim 1, wherein the estimated distorted magnetic fields represent distortion caused by an environment in which the system is operating.

6. The system of claim 1, wherein the system includes one or more of a Virtual Reality (VR) system, an Augmented Reality (AR) system, a Mixed Reality (MR) system, or an electromagnetic tracking (EMT) system.

7. The system of claim 1, wherein the signals received from the magnetic sensor, the distorted magnetic fields, the estimated clean magnetic fields, and the estimated distorted magnetic fields are represented as 3×3 matrices of data.

8. The system of claim 1, wherein the estimated pose is determined by a Kalman filter.

9. The system of claim 8, wherein the Kalman filter is an extended Kalman filter (EKF).

10. The system of claim 9, wherein the EM pose is determined by the EKF based on the signals received from the magnetic sensor.

11. The system of claim 10, wherein the EKF includes functionality for converting disparate raw outputs from the magnetic sensor into the EM pose.

12. The system of claim 11, wherein the inertial data includes inertial raw data, and the EKF includes functionality for converting the inertial raw data into the inertial pose.

13. The system of claim 12, wherein the system is tightly coupled.

14. The system of claim 1, wherein the EM pose is determined by an EM tracker.

15. The system of claim 1, wherein the EM tracker provides the EM pose to an EKF.

16. The system of claim 15, wherein the system is loosely coupled.

17. The system of claim 1, wherein the magnetic transmitter is incorporated into a controller and the magnetic sensor is incorporated into a head-mounted display (HMD).

18. The system of claim 17, wherein the improved EM pose represents a pose of the HMD relative to a pose of the controller.

19. The system of claim 18, wherein the improved EM pose is determined in real-time as the HMD and the controller move about a tracking environment.

20. The system of claim 17, wherein the controller and the HMD each includes an inertial measurement unit (IMU) configured to provide the inertial data.

21. The system of claim 1, further comprising one or more optical sensors configured to provide the optical data.

22. The system of claim 21, wherein the one or more optical sensors include one or more cameras.

23. The system of claim 21, wherein the optical data is used to identify one or more features in a tracking environment and cause the identified features to be displayed on a screen of a HMD.

24. The system of claim 1, wherein the EM pose includes errors due to distortions of the generated magnetic fields in a tracking environment.

25. A method comprising:
receiving, by one or more computer systems, signals from a magnetic sensor, wherein the magnetic sensor is configured to generate the signals based on characteristics of magnetic fields generated by a magnetic transmitter and received at the magnetic sensor;
determining, based on the signals received from the magnetic sensor, an electromagnetic (EM) pose of the magnetic sensor relative to the magnetic transmitter;
determining one or both of: i) an inertial pose of the magnetic sensor relative to the magnetic transmitter based on inertial data associated with the magnetic transmitter and the magnetic sensor, or ii) an optical pose of the magnetic sensor relative to the magnetic transmitter based on optical data associated with the magnetic transmitter and the magnetic sensor;
determining an estimated pose of the magnetic sensor relative to the magnetic transmitter based on the EM pose and the one or both of the inertial pose or the optical pose;
determining distorted magnetic fields based on the EM pose;
determining estimated clean magnetic field values based on the estimated pose;

determining estimated distorted magnetic field values based on differences between the distorted magnetic fields and the estimated clean fields; and determining an improved EM pose of the magnetic sensor relative to the magnetic transmitter based on the estimated distorted magnetic fields.

\* \* \* \* \*